United States Patent
Hayakawa

(10) Patent No.: US 8,654,803 B2
(45) Date of Patent: Feb. 18, 2014

(54) LIGHT EMITTING DEVICE AND METHOD OF CONTROLLING LIGHT EMITTING DEVICE

(71) Applicant: Fujitsu Limited, Kawasaki (JP)

(72) Inventor: Akinori Hayakawa, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/646,748

(22) Filed: Oct. 8, 2012

(65) Prior Publication Data

US 2013/0107900 A1 May 2, 2013

(30) Foreign Application Priority Data

Nov. 1, 2011 (JP) ................................. 2011-240047

(51) Int. Cl.
*H01S 3/04* (2006.01)

(52) U.S. Cl.
USPC ................ 372/34; 372/21; 372/22; 372/36; 372/50.22

(58) Field of Classification Search
USPC ........................ 372/21–22, 34, 36
See application file for complete search history.

(56) References Cited

U.S. PATENT DOCUMENTS

| 7,548,569 B2 * | 6/2009 | Kim et al. ................ 372/36 |
| 7,729,042 B2 | 6/2010 | Egawa |
| 2005/0254531 A1 * | 11/2005 | Furukawa et al. .............. 372/22 |

FOREIGN PATENT DOCUMENTS

| JP | 2000-228556 | 8/2000 |
| JP | 2009-164443 | 7/2009 |

* cited by examiner

*Primary Examiner* — Dung Nguyen
(74) *Attorney, Agent, or Firm* — Fujitsu Patent Center

(57) ABSTRACT

A light emitting device includes a semiconductor laser, which oscillates in a single longitudinal mode, formed above a semiconductor substrate, a first heater, which controls a temperature of the semiconductor laser, provided near the semiconductor laser, a gain unit, which amplifies a beam outputted from the semiconductor laser and outputs an amplified beam, formed above the semiconductor substrate, a second heater, which controls a temperature of the gain unit, provided near the gain unit, and a second harmonic generation element, which converts the amplified beam outputted from the gain unit to a second harmonic light and outputs the second harmonic light.

18 Claims, 28 Drawing Sheets

LIGHT EMITTING DEVICE AND METHOD OF CONTROLLING LIGHT EMITTING DEVICE

CROSS-REFERENCE TO RELATED APPLICATION

This application is based upon and claims the benefit of priority of the prior Japanese Patent Application No. 2011-240047, filed on Nov. 1, 2012, the entire contents of which are incorporated herein by reference.

FIELD

The embodiments discussed herein are related to a light emitting device, which outputs laser beam of multiplied frequencies by using a semiconductor laser and a second harmonic generation element, and a method of controlling a light emitting device.

BACKGROUND

Semiconductor lasers are widely used in various wavelength bands, but recently the demand of green lasers of 530 nm-band is increased as micro projectors and high luminosity factor laser pointers. The semiconductor laser which outputs green is researched and developed in two modes that laser beam in 530 nm-band is directly oscillated and that infrared laser beam oscillated in 1060 nm-band is changed into laser beam of 530 nm-band by second harmonic generation (SHG). Especially in terms of the operational voltage and the wall-plug efficiency (WPE), the later mode using SHG is expected more advantageous.

The device using SHG requires as the master light source of 1060 nm-band a laser light source of the single longitudinal mode oscillation, and for example, a distributed feedback (DFB) laser+an SHG element, a distributed Bragg reflector (DBR) laser+an SHG element, etc. are proposed. In either of these structures, the oscillation wavelength of the semiconductor laser and the wavelength of the quasi phase matching (QPM) of the SHG element have to be precisely matched, and for the wavelength control, generally a thermoelectric cooler (TEC), such as a Peltier element, is used.

However, the power consumption of the TEC reaches about some watts, depending on used environmental temperatures, which has been a barrier to the improvement of the WPE. The modulation of the output intensity is made by modulating the output of the semiconductor laser, i.e., by modulating the drive current, which often drifts the oscillation wavelength from the QPM wavelength of the SHG element.

The structure of the SHG element combined with a master oscillator power amplifier (MOPA) structure including a DFB laser or a DBR laser, and a semiconductor optical amplifier (SOA) is proposed against the difference between the oscillation wavelength and the QPM wavelength. In the MOPA structure, the semiconductor laser is operated at a constant current, and the SOA modulates and adjusts the intensity, whereby the fluctuation of the oscillation wavelength of the semiconductor laser can be suppressed by suppressing the drift from the QPM wavelength of the SHG element.

The followings are examples of related: Japanese Laid-open Patent Publication No. 2000-228556; and Japanese Laid-open Patent Publication No. 2009-164443.

However, because of the very narrow wavelength spectrum of the QPM of the SHG element, influences cannot be disregarded even by a slight thermal crosstalk between the DFB laser and the SOA. For example, one kind of the pattern effect, that the oscillation wavelength of the semiconductor laser is drifted and a power change is caused by the drive signal of the SOA, has often caused waveform distortions in outputs of the SHG element.

Even in the MOPA structure, without the TEC, the difference between the oscillation wavelength of the semiconductor laser and the QPM wavelength of the SHG element is caused also by environmental temperature changes. This is caused by the difference in the temperature dependency between the QPM wavelength of the SHG element and the Bragg wavelength of the diffraction grating which decides the oscillation wavelength of the DFB laser or the DBR laser.

Furthermore, in the MOPA structure, the large difference in the temperature dependency between the oscillation wavelength of the semiconductor laser and the gain spectrum of the SOA is one problem. In the operation without the TEC to improve the WPE, it is preferable to design the detuning between the oscillation wavelength of the semiconductor laser and the gain peak wavelength at the higher temperature condition under which the output characteristics are largely degraded. However, because of the different temperature dependency between the oscillation wavelength of the semiconductor laser and the gain peak wavelength of the SOA as described above, the detuning becomes too large at lower temperature. Resultantly, Fabry-Perot modes often oscillate on the lower temperature, which, even in the MOPA structure, have been a problem in realizing the green laser module of low power consumption without the TEC.

SUMMARY

According to one aspect of an embodiment, there is provided a light emitting device including a semiconductor laser, which oscillates in a single longitudinal mode, formed above a semiconductor substrate, a first heater, which controls a temperature of the semiconductor laser, provided near the semiconductor laser, a gain unit, which amplifies a beam outputted from the semiconductor laser and outputs an amplified beam, formed above the semiconductor substrate, a second heater, which controls a temperature of the gain unit, provided near the gain unit, and a second harmonic generation element, which converts the amplified beam outputted from the gain unit to a second harmonic light and outputs the second harmonic light.

According to another aspect of an embodiment, there is provided a method of controlling a light emitting device including a semiconductor laser which oscillates in a single longitudinal mode, a first heater which controls a temperature of the semiconductor laser, a gain unit which amplifies a beam outputted from the semiconductor laser and outputs an amplified beam, a second heater which controls a temperature of the gain unit, a second harmonic generation element which converts the amplified beam outputted from the gain unit to a second harmonic light and outputs the second harmonic light, and a temperature monitor which measures an environmental temperature, the method including measuring the environmental temperature by the temperature monitor, generating a first drive signal of the first heater for matching an oscillation wavelength of the semiconductor laser with a quasi phase matching wavelength of the second harmonic generation element at the environmental temperature, based on the environmental temperature measured by the temperature monitor, generating a second drive signal of the first heater for compensating a temperature increase of the semiconductor laser by the input signal into the gain unit, based on an input signal for driving the gain unit, and driving the first heater, based on the first drive signal and the second drive signal and controlling the temperature of the semiconductor laser.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

A light emitting device and a method of controlling the light emitting device according to a first embodiment will be described with reference to FIGS. 1 to 26.

Figure 1:
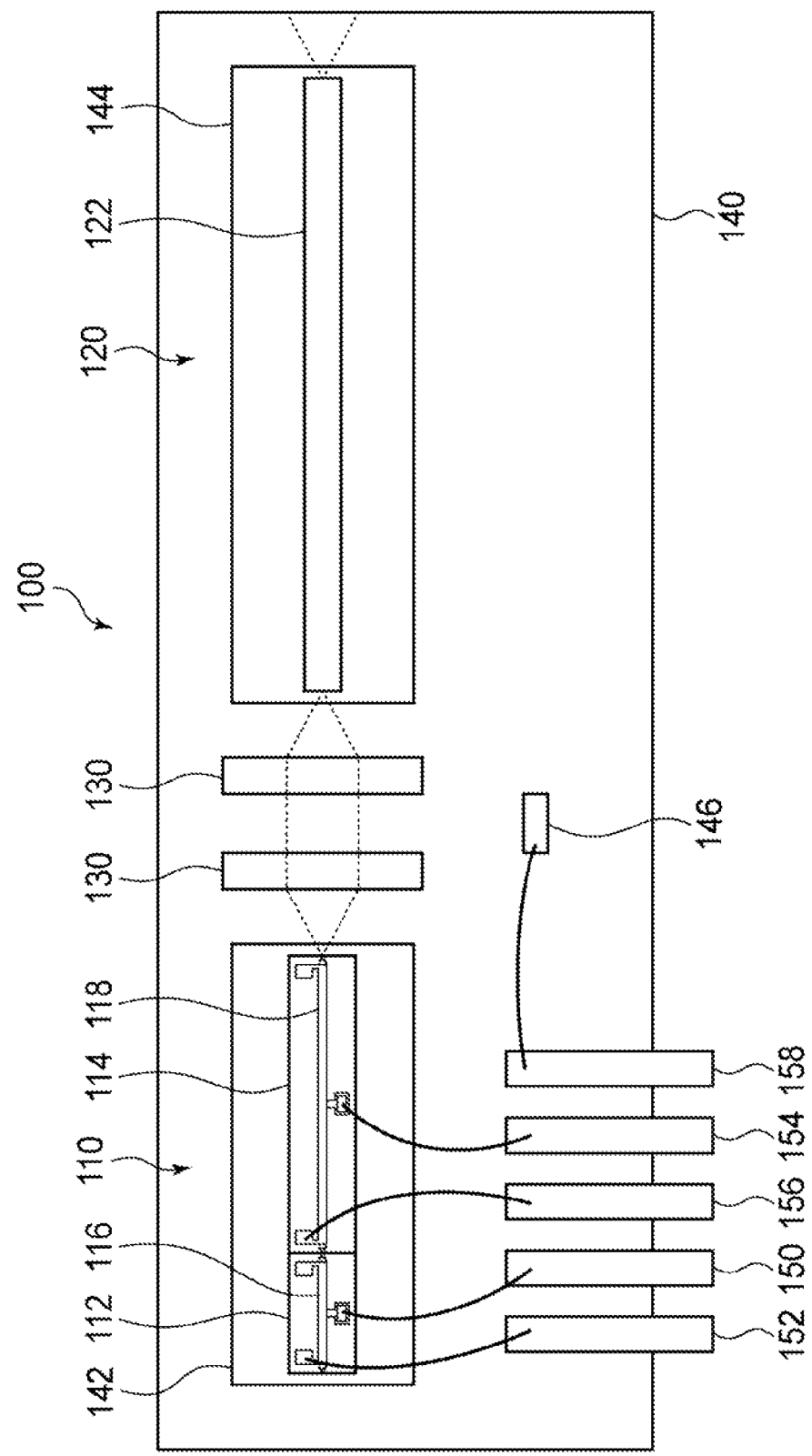
FIG. 1 is a diagrammatic view illustrating a structure of a light emitting element of a light emitting device according to a first embodiment.
Figure 2:
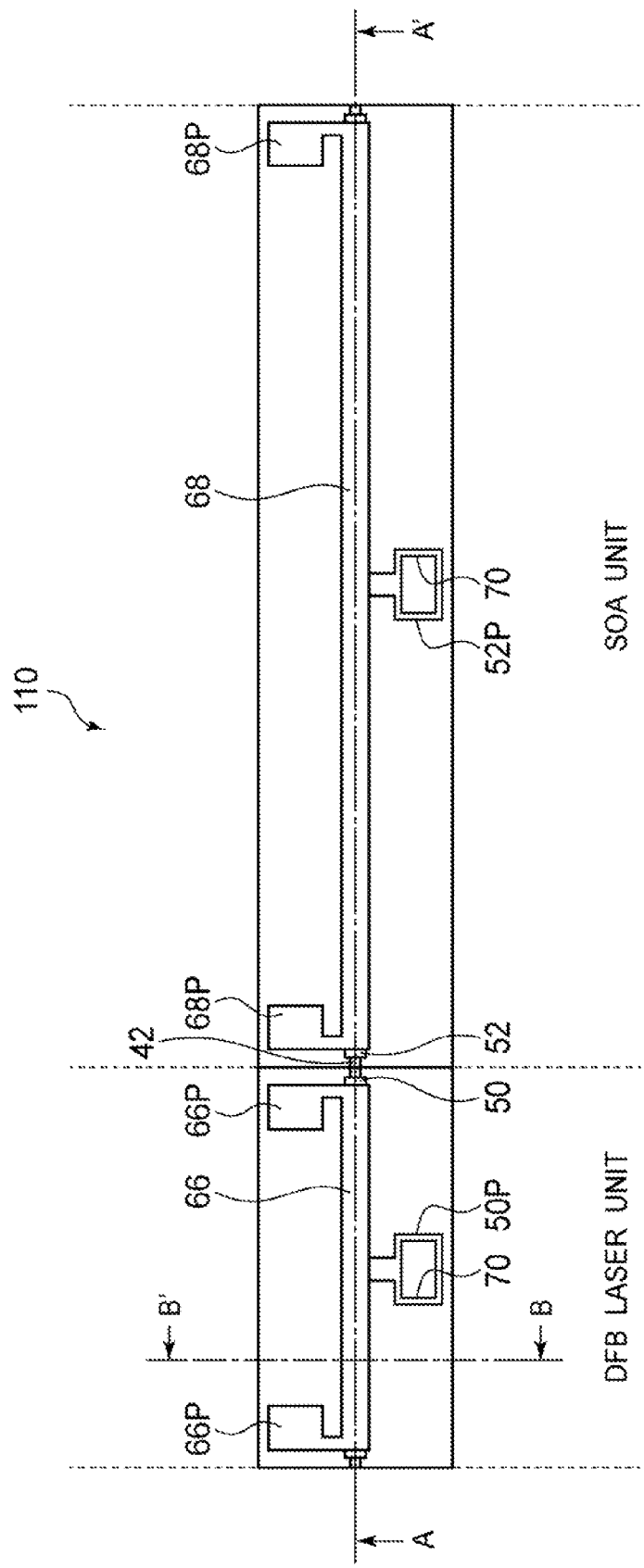
FIG. 2 is a plan view illustrating a structure of a semiconductor light source unit of the light emitting device according to the first embodiment.
Figure 3:
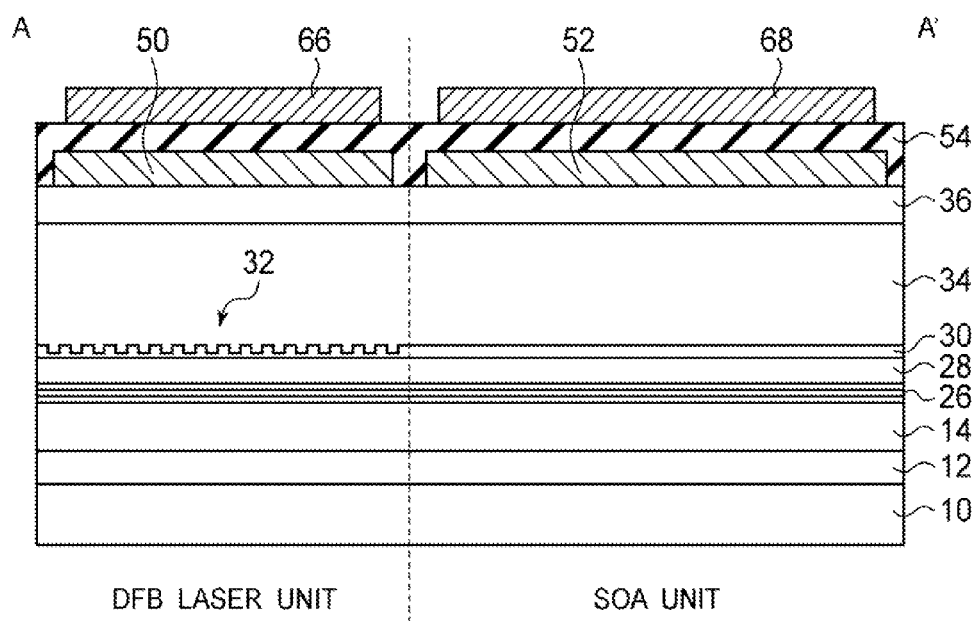
FIGS. 3 and 4 are diagrammatic cross-sectional views illustrating the structure of the semiconductor light source unit of the light emitting device according to the first embodiment.
Figure 4:
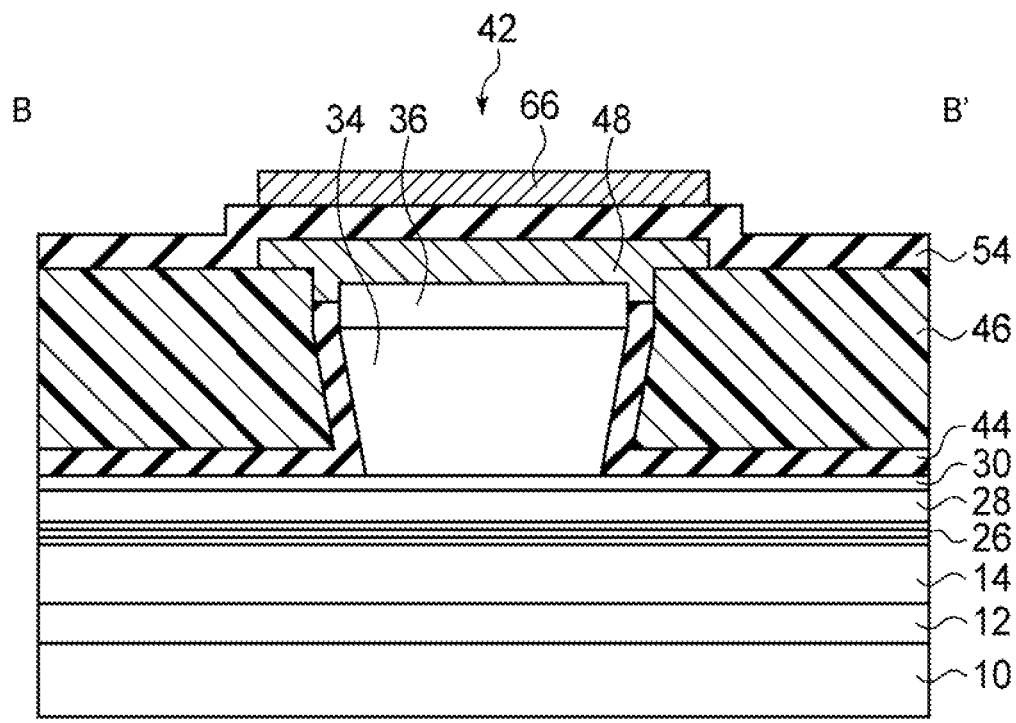

FIG. 1 is a diagrammatic view illustrating a structure of a light emitting element of the light emitting device according to the present embodiment. FIG. 2 is a plan view illustrating a structure of a semiconductor light source unit of the light emitting device according to the present embodiment. FIGS. 3 and 4 are diagrammatic cross-sectional views illustrating the structure of the semiconductor light source unit of the light emitting device according to the present embodiment.

Figure 5:
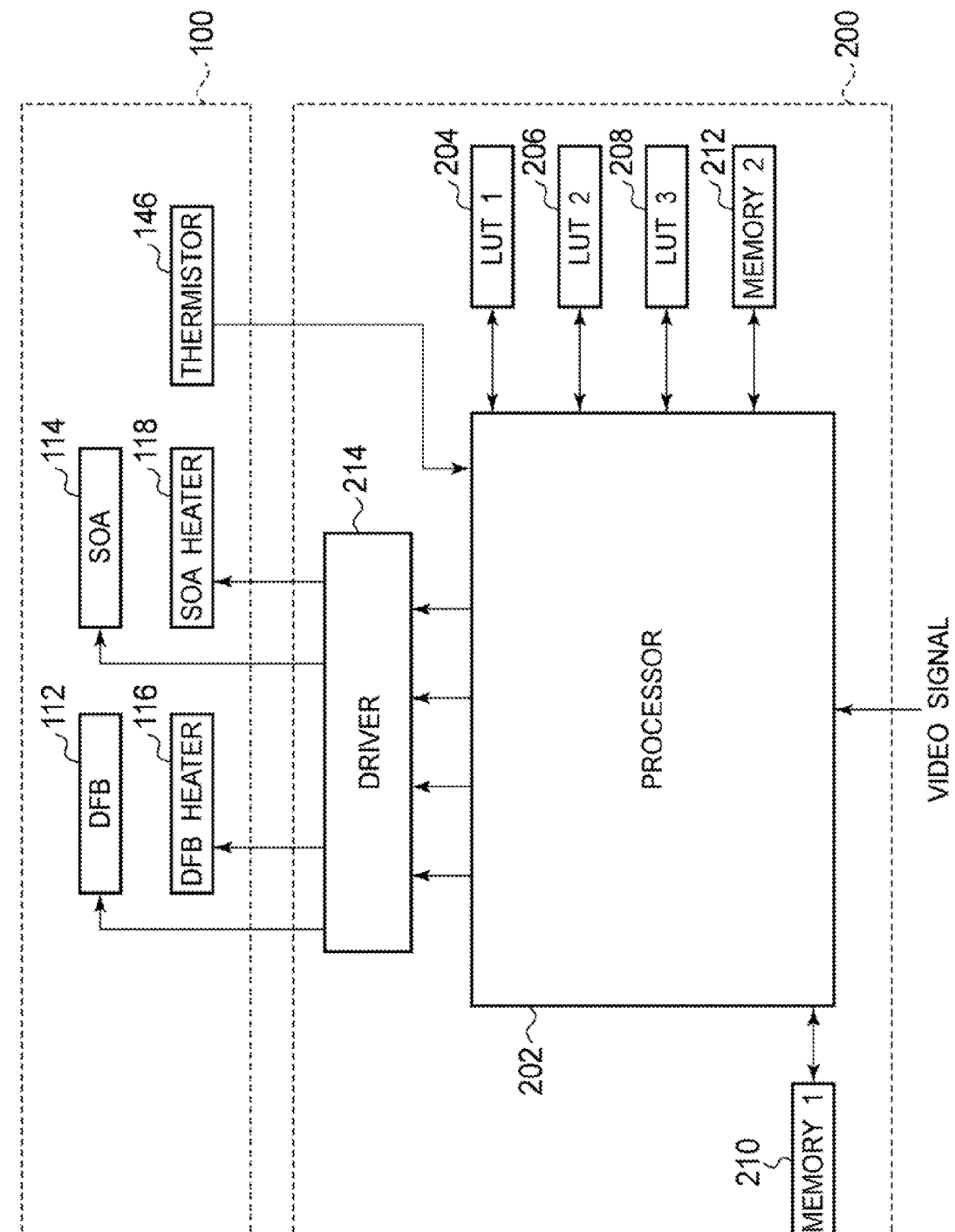
FIG. 5 is a block diagram illustrating a structure of a drive unit of the light emitting device according to the first embodiment.
Figure 6:
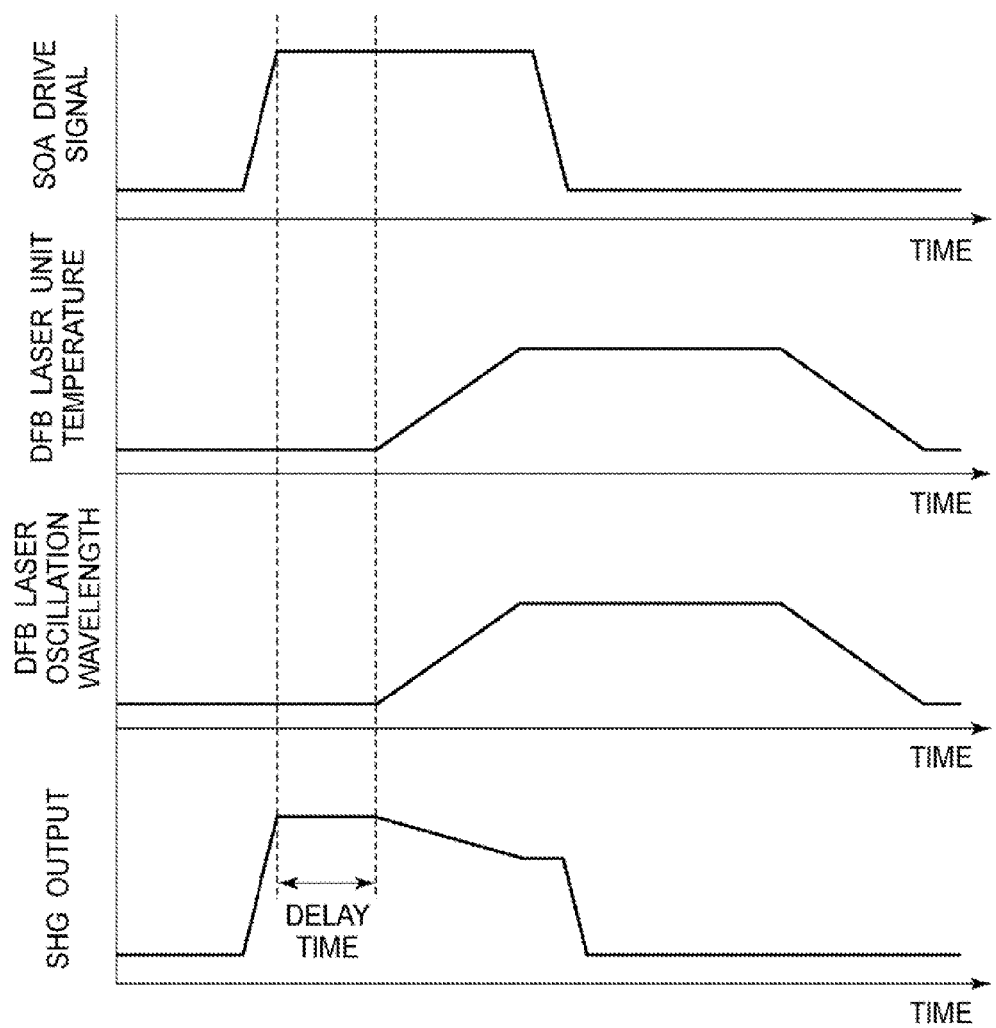
FIG. 6 is a timing chart explaining a distortion of an output waveform due to a fluctuation of an oscillation wavelength of the DFB laser.
Figure 7:
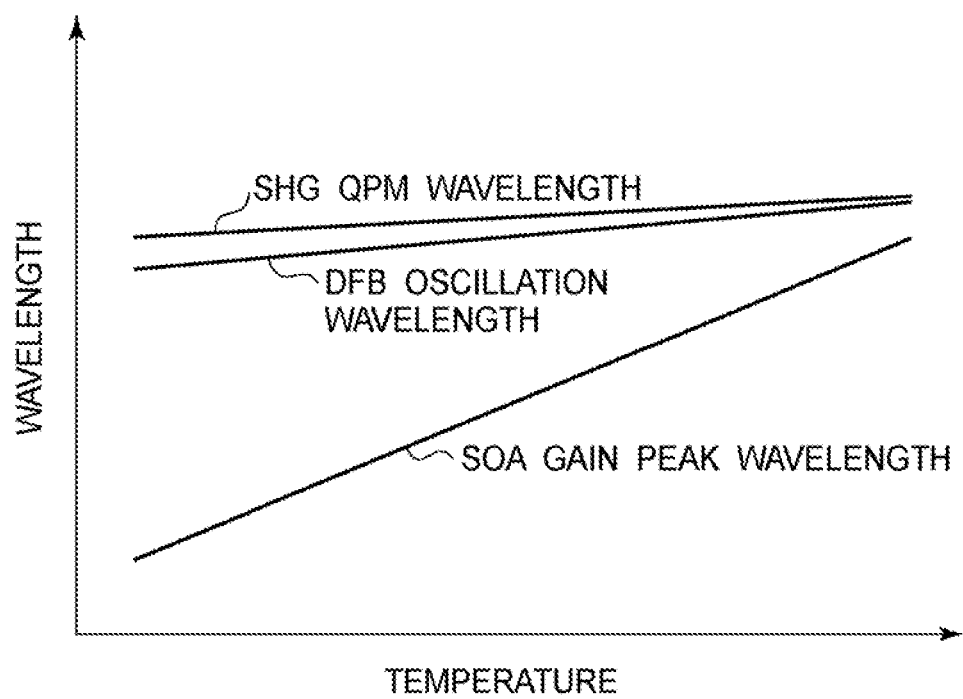
FIG. 7 is a graph illustrating a temperature dependency of the QPM wavelength of the SHG element, an oscillation wavelength of the DFB laser and a gain peak wavelength of the SOA.
Figure 8:
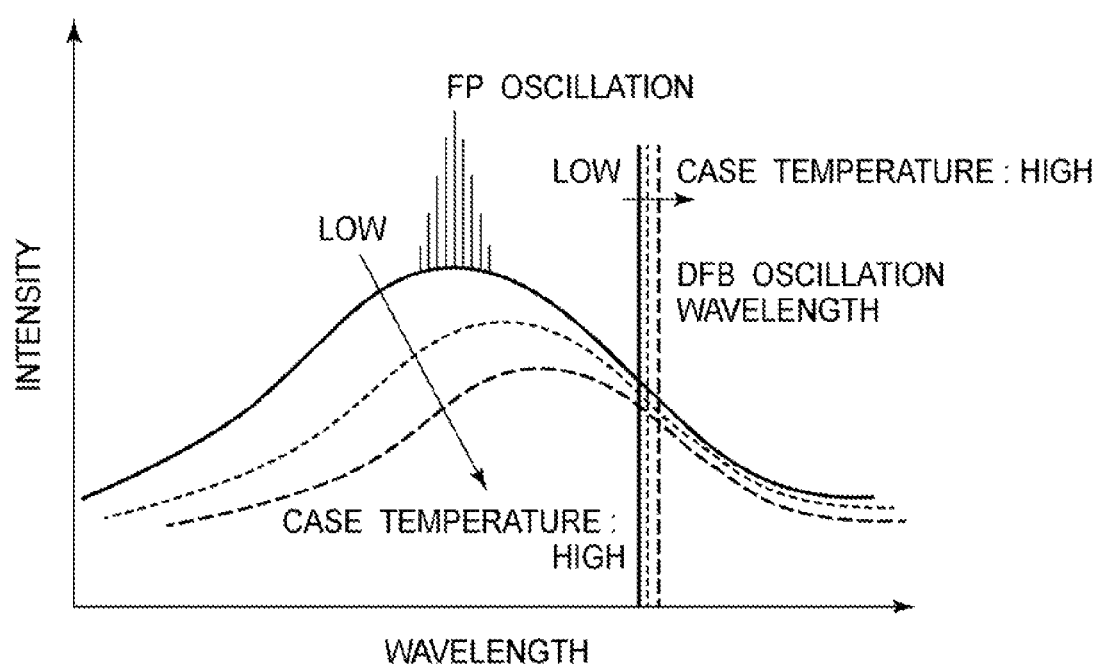
FIG. 8 is a graph illustrating one example of changes of the oscillation wavelength of the DFB laser and the gain spectrum of the SOA due to the environmental temperature change.
Figure 9:
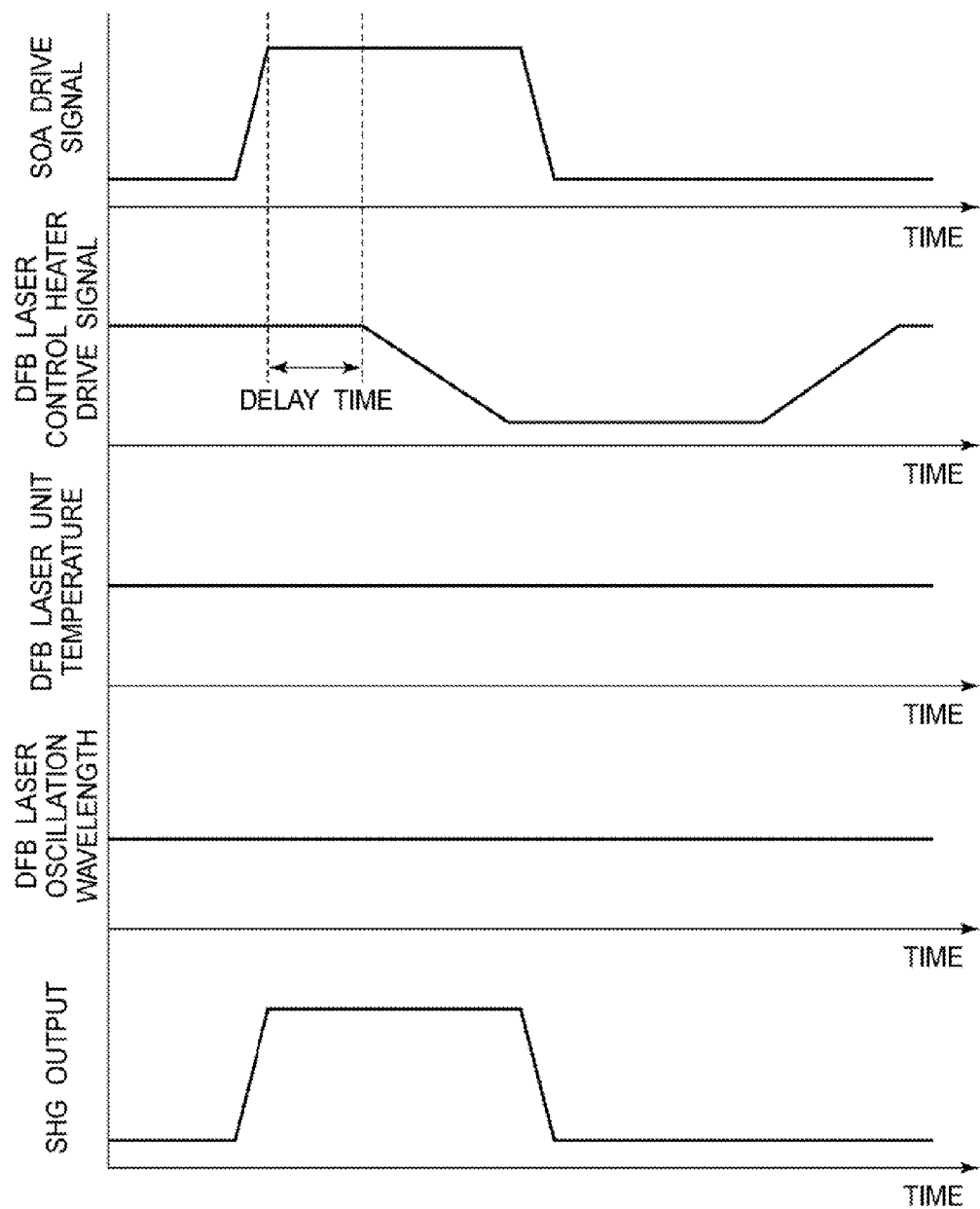
FIG. 9 is a timing chart illustrating an operation of the light emitting device according to the first embodiment.

FIG. 5 is a block diagram illustrating a structure of a drive unit of the light emitting device according to the present embodiment. FIG. 6 is a timing chart explaining a distortion of an output waveform due to a fluctuation of an oscillation wavelength of the DFB laser. FIG. 7 is a graph illustrating a temperature dependency of the QPM wavelength of the SHG element, an oscillation wavelength of the DFB laser and a gain peak wavelength of the SOA. FIG. 8 is a graph illustrating one example of changes of the oscillation wavelength of the DFB laser and the gain spectrum of the SOA due to the environmental temperature change. FIG. 9 is a timing chart illustrating an operation of the light emitting device according to the first embodiment. FIGS. 10-26 are views illustrating a method of manufacturing the semiconductor light source unit of the light emitting device according to the present embodiment.

First, the structure of the light emitting device according to the present embodiment will be described with reference to FIGS. 1 to 5.

The light emitting device according to the present embodiment includes a light emitting element 100, and a control unit 200 which controls the light emitting element 100.

As illustrated in FIG. 1, the light emitting element 100 includes a semiconductor light source unit 110 which is the master light source, and an SHG unit 120 which generates second harmonics from output light of the semiconductor light source unit 110. The semiconductor light source unit 110 and the SHG unit 120 are optically coupled with each other by lenses 130.

The semiconductor light source unit 110 is mounted on a heat sink 142 provided in a case 140 and includes a DFB laser (semiconductor laser) 112 and an SOA (gain unit) 114 integrated on a semiconductor substrate. Near the DFB laser 112 and the SOA 114, thin film heaters 116, 118 are respectively provided. The SHG element unit 120 is mounted on a heat sink 144 provided in the case 140 and includes an SHG (second harmonic generation) element 122.

The structure of the semiconductor light source unit 110 will be more specifically described with reference to FIGS. 2 to 4. FIG. 3 is the A-A' line cross-sectional view of FIG. 2, and FIG. 4 is the B-B' line cross-sectional view of FIG. 2.

An n-GaAs buffer layer 12, n-AlGaAs clad layer 14, an active layer 26, a p-AlGaAs clad layer 28, a p-GaAs diffraction grating layer 30, a p-InGaP upper clad layer 34 and a p-GaAs contact layer 36 are sequentially formed above an n-GaAs substrate 10. In the p-GaAs diffraction layer 30 of the DFB laser unit, a diffraction grating 32 is formed. The p-InGaP upper clad layer 34 and the p-GaAs contact layer 36 are processed in a ridge shape, forming a ridge waveguide structure 42. A protection film 44 and an organic insulating layer 46 are formed above the side walls of the ridge waveguide structure 42.

A DFB laser control electrode 50 is provided above the p-GaAs contact layer 36 of the DFB laser unit. An electrode pad 50P is connected to the DFB laser control electrode 50 and exposed by a pad opening 70 formed in the protection film 54. A DFB laser control heater 66 is formed above the DFB laser control electrode 50 with the protection film 54 formed therebetween. The electrode pads 66P are connected to the DFB laser control heater 66.

An SOA control electrode 52 is provided above the p-GaAs contact layer 36 of the SOA unit. An electrode pad 52P is connected to the SOA control electrode 52 and is exposed by a pad opening 70 formed in the protection film 54. An SOA control heater 68 is formed above the SOA control electrode 52 with the protection film 54 formed therebetween. Electrode pads 68P are connected to the SOA control heater 68.

A coating (not illustrated), which is a reflection film, is formed on a cleavage surface of the ridge waveguide structure 42 on the side of the DFB laser unit side, and a coating (not illustrated), which is an antireflection film, is formed on a cleavage surface of the ridge waveguide structure 42 on the side of the SOA unit.

The DFB laser 112 and the SHG element 122 are so designed that the oscillation wavelength of the DFB laser 112 and the QPM wavelength of the SHG element 122 at a high temperature (e.g., 80° C.) match with each other. The SOA 114 is so designed that the gain peak wavelength at a high temperature (e.g., 80° C.) is positioned nearer the shorter wavelength side by a prescribed value (e.g., 7 nm) than the oscillation wavelength of the DFB laser 112. The high temperature is, e.g., a maximum value of the environmental temperatures assumed in operation. The detuning between the gain peak wavelength of the SOA 114 and the oscillation wavelength of the DFB laser 112 is a suitable prescribed value necessary to maintain output characteristics.

The electrode pad 50P of the DFB laser 112 and one electrode pad 66P of the thin film heater 116 (DFB laser control heater 66) are connected respectively to outside connection terminals 150, 152 by wires. The electrode pad 52P of the SOA 114 and one electrode pad 68P of the thin film heater 118 (SOA control heater 68) are respectively connected to outside connection terminals 154, 156 by wires. The other electrode pads 66P, 68P of the thin film heaters 116, 118 are connected to a reference potential (e.g., the ground potential) by wires not illustrated.

A thermistor 146 for monitoring temperature information of the case is provided above the case 140. The thermistor 146 is connected to an outside connection terminal 158 by a wire.

The outside connection terminals 150, 152, 154, 156, 158 of the light emitting element 100 are connected to a control unit 200.

As illustrated in FIG. 5, the control unit 200 includes a processor 202 for signal processing. The control unit 200 further includes a look-up table (LUT1) 204 which stores the drive signal (DC component) of the DFB laser control heater 116 for the environmental temperature. The control unit 200 further includes a look-up table (LUT2) 206 which stores the drive signal (RF component) of the DFB laser control heater 116 for the input signal to the SOA 114. The control unit 200 further includes a look-up table (LUT3) 208 which stores the drive signal of the SOA control heater 118 for the environmental temperature. The control unit 200 further includes a memory (memory 1) 210 which stores information for adding a delay to a drive signal of the DFB laser control heater 116. The control unit 200 further includes a memory (memory 2) 212 which stores drive conditions, etc. of the DFB laser 112. The control unit 200 further includes a driver 214 which drives the DFB laser 112, the SOA 114, the DFB laser control heater 116 and the SOA control heater 118 corresponding to signals outputted from the processor 202.

Next, before the operation of the light emitting device according to the present embodiment is described, problems of the light emitting device of the MOPA structure will be described again with reference to FIGS. 6 to 8.

As described above, in the MOPA structure, the semiconductor laser makes the constant-current operation, the SOA modulates and adjusts the intensity to thereby suppress the oscillation wavelength drift in the semiconductor laser unit, whereby the drift from the QPM wavelength of the SHG element can be suppressed.

However, because of the very narrow wavelength spectrum of the QPM wavelength of the SHG element, influences cannot be disregarded even by a slight thermal crosstalk between the DFB laser and the SOA. For example, due to one kind of the pattern effect that the oscillation wavelength of the DFB laser is drifted and a power change is caused by the drive signal of the SOA, waveform distortions have often took place in outputs of the SHG element.

As exemplified in FIG. 6, when a drive signal is inputted in the SOA, by the temperature increase due to the operation of the SOA, the temperature of the DFB laser is raised with the time lag (the delay time in the graph). When the temperature of the DFB laser unit rises, the refractive index in the waveguide changes, and the oscillation wavelength shifts to the longer wavelength side. This lowers the SHG output after the delay time, and a waveform distortion takes place in the output of the SHG element. Thus, the waveform distortion takes place due to the thermal interference with a certain delay time.

Even in the MOPA structure, without the TEC, the difference between the oscillation wavelength of the DFB laser and the QPM wavelength of the SHG element is caused also by environmental temperature changes. This is caused by the difference in the temperature dependency between the QPM wavelength of the SHG element and the Bragg wavelength of the diffraction grating which decides the oscillation wavelength of the DFB laser. Additionally, in the MOPA structure, the large temperature dependency between the oscillation wavelength of the DFB laser and the gain spectrum of the SOA is also a cause.

As exemplified in FIG. 7, the temperature dependency of the DFB laser 112 is about 0.10 nm/deg. On the other hand, the temperature dependency of the QPM wavelength of the SHG element 122 is about 0.08 nm/deg. The temperature dependency of the gain peak wavelength of the SOA 114 is about 0.40 nm/deg.

For the operation without the TEC for the purpose of improving the WPE, it is preferable to design the detuning between the oscillation wavelength of the semiconductor laser and the gain peak wavelength of the SOA at the higher temperature conditions under which the degradation of the output characteristics is large. However, because of the different temperature dependency between the oscillation wavelength of the DFB laser and the gain peak wavelength of the SOA as described above, the detuning reversely becomes too large at lower temperature (see FIG. 8). Thus, Fabry-Perot modes (FP oscillation) oscillate at lower temperature, and even the MOPA structure has the problem for realizing the green laser module of low power consumption without the TEC.

Next, the operation of the light emitting device according to the present embodiment will be described with reference to FIGS. 1, 2 and 5.

A video signal, and temperature information of the case 140 measured by the thermistor 146 are inputted into the processor 202 of the control unit 200. The video signal is a drive signal of the light emitting device and contains ON/OFF of display, information of an emission intensity, and others. The temperature information of the case 140 is to be used as an environmental temperature to be used in feedback controlling the semiconductor light source unit 110.

The temperature information of the case 140 is obtained and updated by, e.g., every 100 msec although not specifically limited. This is far slower in comparison with the signal given by time-averaging an SOA drive signal which will be described later and can be a DC component of the heater drive signal. Preferably, the resolution of the temperature information is decided in consideration with the QPM wavelength spectrum of the SHG element 122 and is, e.g., 0.1 deg although not specifically limited.

The processor 202 obtains the DC component of the drive signal of the DFB laser control heater 116, based on the inputted temperature information of the case 140 and with reference to the lookup table (LUT1) 204. The lookup table (LUT1) 204 stores, for respective case temperatures, values (information of the electric powers applied to the DFB laser control heater 116) of the drive signal of the DFB laser control heater 116 necessary to match the oscillation wavelength of the DFB laser 112 with the QPM wavelength of the SHG element 122.

As described above, the temperature dependency of the QPM wavelength of the SHG element 122 is about 0.08 nm/deg, and the temperature dependency of the DFB laser 112 is about 0.10 nm/deg. Because the DFB laser control heater 116 mounted on the DFB laser 112 functions only in the direction of increasing the temperature, the oscillation wavelength of the DFB laser 112 is set in advance so that the oscillation wavelength of the DFB laser 112 and the QPM wavelength of the SHG element match with each other at higher temperature. That is, at lower temperature, the DFB laser control heater 116 is driven to shift the oscillation wavelength of the DFB laser 112 to the longer wavelength side to be matched with the QPM wavelength of the SHG element 122. For example, the QPM wavelength of the SHG element 122 is set 1061.0 nm at 25° C. and 1065.4 nm at 80° C., and the oscillation wavelength of the DFB laser 112 is set 1059.9 nm at 25° C. and 1065.4 nm at 80° C.

For example, when the case temperature is 25° C., the DFB laser control heater 116 is so driven that the oscillation wavelength of the DFB laser 112 is shifted from 1059.9 nm to 1061.0 nm to match with the QPM wavelength of the SHG element 122. The lookup table (LUT1) 204 stores a value (information of the electric powers to be applied to the DFB laser control heater 116) of the drive signal of the DFB laser control heater 116, which is required at this time.

The value of the drive signal of the DFB laser control heater 116 obtained with reference to the lookup table (LUT1) 204 is a value of the DC component of the drive signal of driving the DFB laser control heater 116.

Simultaneously therewith, the processor 202 makes the time-averaging processing, based on the inputted video signal, refers to the lookup table (LUT2) 206, based on the value obtained by the averaging processing, and obtains a drive signal of the DFB laser control heater 116.

As described above, the output of the DFB laser 112 is disturbed by the heat generated by the intensity modulation signal inputted in the SOA 114 and has a waveform distortion (see FIG. 6). The lookup table (LUT2) 206 stores drive signal information for the DFB laser control heater 116, which cancels such thermal interference. That is, the lookup table (LUT2) stores, for the input signals into the SOA 114, values of the drive signal of the DFB laser control heater 116, which are necessary to compensate temperature increases of the DFB laser 112 by the input signals into the SOA 114. To refer to the lookup table (LUT2) 206, it is preferable to use a time-averaged data of SOA intensity modulation signal, i.e., video signal.

The video signal inputted into the processor 202 is transmitted to the SOA 114 via the processor 202 and the driver 214 but, simultaneously therewith, time-averaged by the processor 202. The averaging time width optimum for the averaging processing for the SOA drive signal can be, e.g., about 100 msec although varying depending on the element structures, the module members and the mounting modes.

The processor 202 refers to the lookup table (LUT2) 206, based on data given by the time averaging processing, and obtains a drive signal of the DFB laser control heater 116. This signal is a signal of the same frequency as the video signal of about 100 MHz and is of far higher frequency than the drive signal of the DFB laser control heater 116.

The value of the drive signal of the DFB laser control heater 116 obtained with reference to the lookup table (LUT2) 206 is to be a value of the RF component of the drive signal in driving the DFB laser control heater 116.

The heat generated in the SOA 114 by the intensity modulation conducts up to the DFB laser 112 with a time delay. Accordingly, it is preferable to delay the input of the RF component of the drive signal of the DFB laser control heater 116 by a period of time necessary for the heat conduction from the SOA 114 to the DFB laser 112.

For this, the thus-obtained drive signal of the DFB laser control heater 116 is temporarily stored in a memory 210, to be read from the memory 210 after a prescribed period of time and to be used to drive the DFB laser control heater 116. The delay time of the thermal interference between the SOA 114 and the DFB laser 112 is, e.g. about 5 msec although varying depending on the element structures, the module members and the mounting modes.

Thus, the processor 202 obtains the DC component of the drive signal of the DFB laser control heater 116 obtained from the lookup table (LUT1) 204, and the RF component of the drive signal of the DFB laser control heater 116 obtained from the lookup table (LUT2) 206. Then, the processor 202 superposes the DC component and the RF component of the drive signal of the DFB laser control heater 116 and generates the drive signal of the DFB laser control heater 116.

Simultaneously therewith, the processor 202 refers to the lookup table (LUT 3) 208, based on the inputted temperature information of the case 140 and obtains a drive signal of the SOA control heater 118. The lookup table (LUT3) 208 stores, for respective case temperatures, values (information of the electric powers to be applied to the SOA control heater 118) of drive signals of the SOA control heater 118, which are required to make the detuning between the QPM wavelength of the SHG element 122 and the gain peak wavelength of the SOA 114 smaller than a prescribed value. The prescribed value of the detuning is a detuning between the QPM wavelength of the SHG element 122 and the gain peak wavelength of the SOA 114 for suppressing the FP oscillation of the SOA 114.

As described above, the oscillation wavelength of the DFB laser 112 is controlled to match with the QPM wavelength of the SHG element 122. Accordingly, the detuning between the gain peak wavelength of the SOA 114 and the oscillation wavelength of the DFB laser 112 is also considered, based on the adjusted oscillation wavelength of the DFB laser 112. The adjusted oscillation wavelength of the DFB laser 112 means, i.e., the QPM wavelength of the SHG element 122.

What is to be considered in the detuning adjustment are to maintain the output characteristics at higher temperature and to suppress excessive detunings so that no FP oscillation takes place at lower temperature. The SOA control heater 118 mounted on the SOA 114 also functions in the direction of increasing the temperature, and the detuning is so set that the output characteristics are advantageous at higher temperature, and at lower temperature, the SOA control heater 118 is driven to shift the SOA gain peak wavelength to the longer wavelength side to thereby suppress the FP oscillation.

For the detuning at higher temperature, the examination by the inventor of the present application has confirmed that the SOA gain peak wavelength is so set that the detuning for the oscillation wavelength of the DFB laser becomes −7 nm at 80° C., whereby the drop of the output characteristics can be suppressed. Then, the gain peak wavelength of the SOA 114 is so set in advance that the detuning of the gain peak wavelength of the SOA 114 for the oscillation wavelength of the DFB laser at higher temperature becomes, e.g., −7 nm. With the QPM wavelength of the SHG element 122 and the oscillation wavelength of the DFB laser 112 at 80° C. set at 1065.4 nm as described above, the gain peak wavelength of the SOA 114 at 80° C. is 1058.4 nm for the detuning of −7 nm.

The temperature dependency of the gain peak wavelength of the SOA 114 is about 0.40 nm/deg as described above, and in this case, the gain peak wavelength of the SOA 114 becomes 1036.4 nm at 25° C. and 1026.4 nm at 0° C. The detuning of the gain peak wavelength of the SOA 114 at 0° C., and the QPM wavelength of the SHG element and the adjusted oscillation wavelength of the DFB laser 112 becomes −32.6 nm.

The detuning which is the criterion for the FP oscillation varies, depending on various parameters, such as the gain characteristics and loss characteristics of the elements, the reflectances on both end surfaces of the elements, etc., but the examination of the inventor of the present application has confirmed that when the detuning becomes about −30 nm, the risk of the FP oscillation increases. The possibility of the FP oscillation depends on the manufacture variation of the elements, and the criterion for the detuning is set here at −28 nm which has an allowance. In this case, the SOA control heater 118 is so driven that no FP modes do not oscillate at lower temperature to thereby shift the gain peak wavelength of the SOA 114 to the longer wavelength side, whereby the detuning is adjusted not to become not less than 28 nm. The lookup table (LUT 3) 208 stores information of the power to be applied to the SOA control heater 118, which is required at this time.

The value of the drive signal of the SOA control heater 118 obtained with reference to the lookup table (LUT3) 208 becomes the value of the drive signal in driving the SOA control heater 118.

The processor 202 transmits to the driver 214 the drive signal of the DFB laser control heater 116 and the drive signal of the SOA control heater 118 thus generated. The processor 202 obtains driving conditions of the DFB laser 112 from the memory 212 in the control unit and transmits them to the driver 214. The processor 202 transmits to the driver 214 the video signal inputted from the outside to generate the SOA drive signal. The driver 214 controls the light emitting element 100, based on the various drive signals inputted from the processor 202 and the light emitting element 100 emits light corresponding to the video signal.

By making the control described above, even when the environmental temperature, i.e., the case temperature changes, the QPM wavelength of the SHG element 122, the oscillation wavelength of the DFB laser 112 and the gain peak wavelength of the SOA 114 are retained in the suitable relationships, whereby the degradation of the output characteristics can be suppressed. The waveform distortion due to thermal crosstalk accompanying the intensity drift of the SOA 114 can be suppressed.

FIG. 9 is a diagrammatic view of the timing chart among the drive signal of the SOA 114, the temperature change of the DFB laser 112, the oscillation wavelength of the DFB laser 112, the output power of the SHG element 122 and the drive signal of the DFB laser control heater 116 when the drive signal of the DFB laser control heater 116 corresponding to the drive signal of the SOA 114 is applied.

As illustrated in FIG. 9, with the delay time taking into account the heat conduction time from the SOA 114 to the DFB laser 112, the drive signal of the DFB laser control heater 116 corresponding to the drive signal of the SOA 114 is applied, whereby the temperature of the DFB laser 112 can be retained constant. Thus, the oscillation wavelength of the DFB laser 112 can be retained constant, and the distortion of the waveform of the SHG output can be suppressed.

In the light emitting device according to the present embodiment, the temperature control of the DFB laser 112 and the SOA 114 is made by the thin film heater, whereby in comparison with the temperature control by using the TEC, power consumption can be decreased, and the wall-plug efficiency can be improved.

The semiconductor light source unit 110 and the SHG element unit 120 are formed on different heat sinks 142, 144, whereby the influence of the heating of the DFB laser 112 and the SOA 114 on the SHG element 122 can be suppressed.

Figure 10:
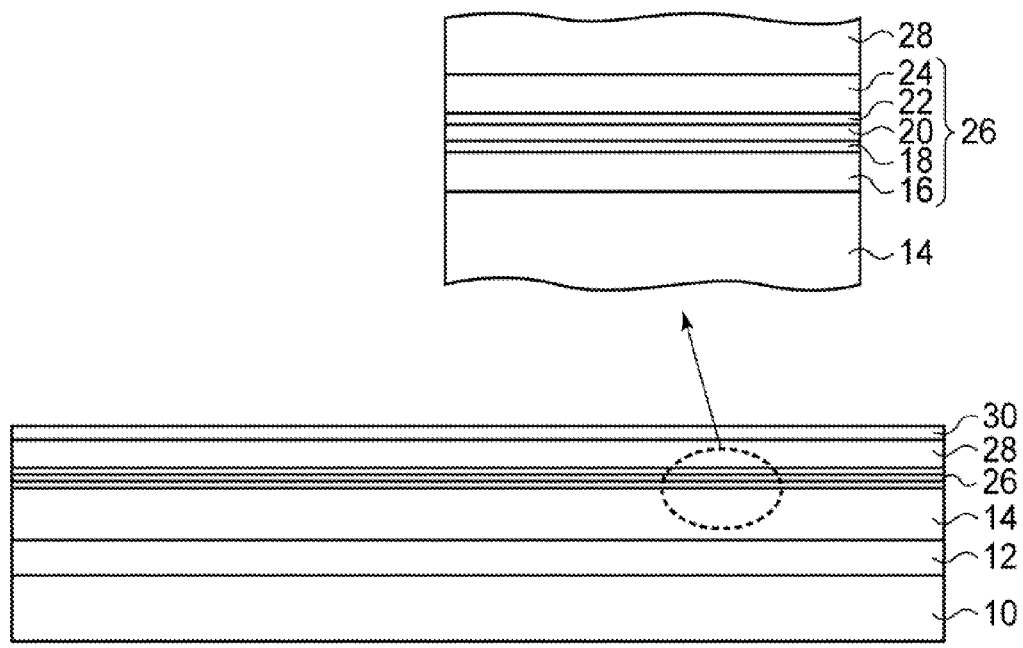
FIGS. 10, 11, 12, 13, 14, 16, 17, 18, 20, 21, 22, 23 and 24 are cross-sectional views illustrating a method of manufacturing the semiconductor light source unit of the light emitting device according to the first embodiment.
Figure 11:
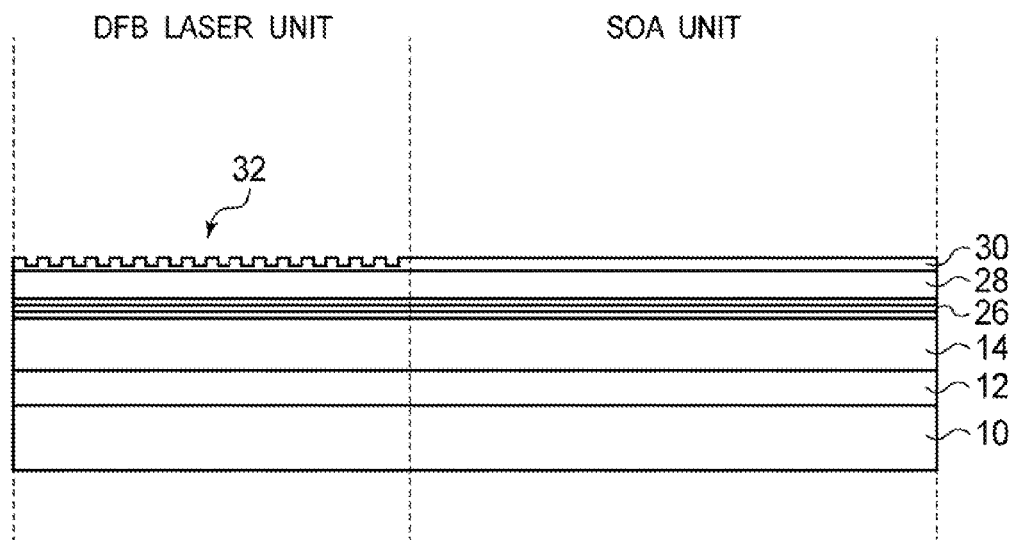
Figure 12:
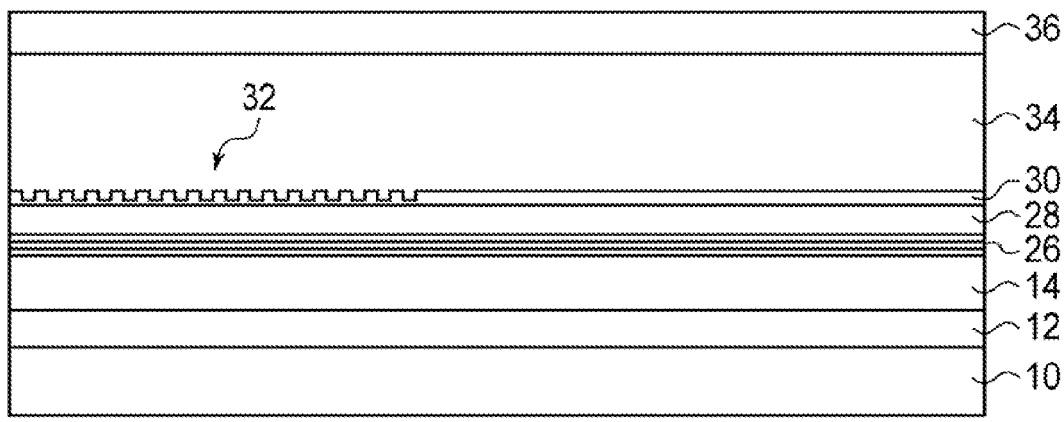

Next, the method of manufacturing the light emitting element 100 according to the present embodiment will be described with reference to FIGS. 10 to 26. FIGS. 10 to 12 are cross-sectional views of the light emitting element in the manufacturing steps along the A-A' line of FIG. 2. FIGS. 13, 14, 16-18 and 20-24 are cross-sectional views of the light emitting element in the manufacturing steps along the B-B' line of FIG. 2. FIGS. 15, 19, 25 and 26 are plan views of the surface states of the light emitting element in the manufacturing steps.

First, a 300 nm-thickness n-GaAs, for example, is epitaxially grown above, e.g., the n-GaAs substrate 10 by metal organic chemical vapor deposition (MOCVD) method to form the n-GaAs buffer layer 12.

Then, a 2000 nm-thickness n-AlGaAs, for example, is epitaxially grown above the n-GaAs buffer layer 12 by, e.g., MOCVD method to form the n-AlGaAs clad layer 14.

Then, a 40 nm-thickness i-GaAs, a 7 nm-thickness i-InGaAs, a 20 nm-thickness i-GaAs, a 7 nm-film thickness i-InGaAs and a 40 nm-thickness i-GaAs are sequentially epitaxially grown above the n-AlGaAs clad layer 14 by, e.g., MOCVD method. Thus, the active layer 26 including the two i-InGaAs well layers 18, 22 stacked with the i-GaAs barrier layer 20 formed therebetween, which are sandwiched by the i-GaAs SCH layers 16, 24 is formed above the n-AlGaAs clad layer 14. A multiple quantum well (MQW) layer including the i-InGaAs well layers 18, 22 stacked with the i-GaAs barrier layer 20 formed therebetween is formed here, but the layer number of the well layer is not limited two layers.

Then, a 150 nm-thickness p-AlGaAs, for example, is epitaxially grown above the active layer 26 by, e.g., MOCVD method to form the p-AlGaAs clad layer 28.

Next, a p-GaAs is epitaxially grown above the p-AlGaAs clad layer 28 by, e.g., MOCVD method to form the p-GaAs diffraction grating layer 30 (FIG. 10).

Then, the diffraction grating pattern 32 is formed on the surface of the p-GaAs diffraction grating layer 30 (FIG. 11). For example, a resist film is applied onto the p-GaAs diffraction grating layer 30. Then, the diffraction grating pattern is exposed to the resist film by electron beam exposure or interference exposure. Next, the resist film is developed to transfer the diffraction grating pattern to the resist film. Then, with the developed resist film as the mask, the surface of the p-GaAs diffraction grating layer 30 is etched by, e.g., about 25 nm to form the diffraction grating pattern 32. For the etching of the p-GaAs diffraction grating layer 30, a mixed solution of ammonia water, hydrogen peroxide water and water can be used. The diffraction grating pattern 32 is formed only in the DFB laser unit and is not formed in the SOA unit. With the period of the diffraction grating pattern 32 set at 155.6 nm, Λ Bragg wavelength of around about 1060 nm can be obtained.

Then, a 1000 nm-thickness p-InGaP, for example, is epitaxially grown above the p-GaAs diffraction grating layer 30, filling the diffraction grating pattern 32 by, e.g., MOCVD method to form the p-InGaP upper clad layer 34.

Next, a 300 nm-thickness p-GaAs, for example, is epitaxially grown above the p-InGaP upper clad layer 34 by, e.g., MOCVD method to form the p-GaAs contact layer 36 (FIG. 12).

Next, a silicon oxide film 38 is formed above the p-GaAs contact layer 36 by, e.g., CVD method.

Figure 13:
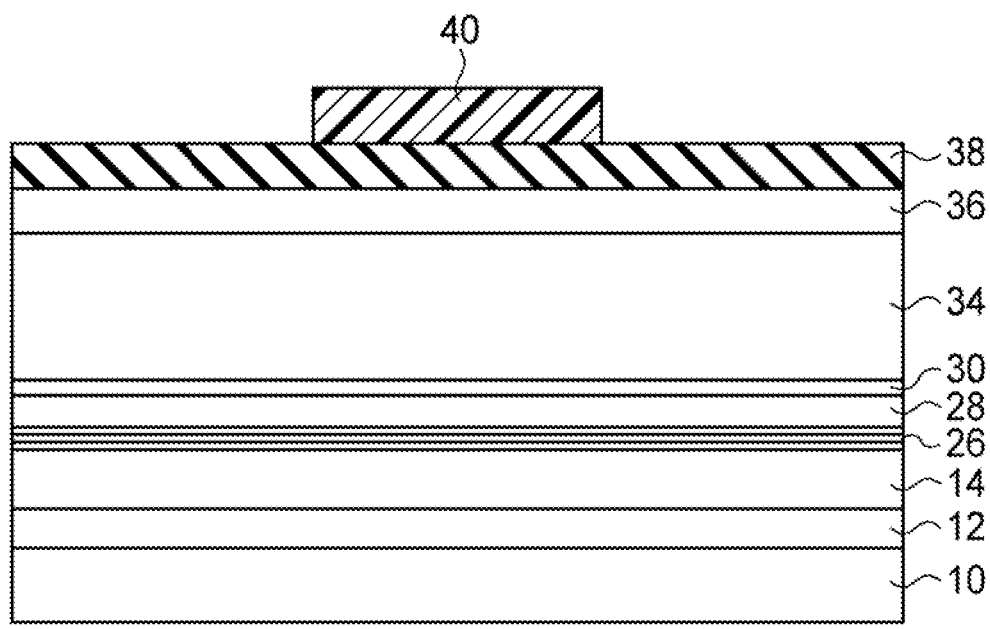

Then, a photoresist film 40 having the pattern of the waveguide of the DFB laser and the SOA is formed above the silicon oxide film 38 by photolithography (FIG. 13).

Next, the silicon oxide film 38 is etched with the photoresist film 40 as the mask by wet etching using, e.g., a buffer hydrofluoric acid aqueous solution to transfer the waveguide pattern to the silicon oxide film 38.

Next, the photoresist film 40 is removed.

Figure 14:
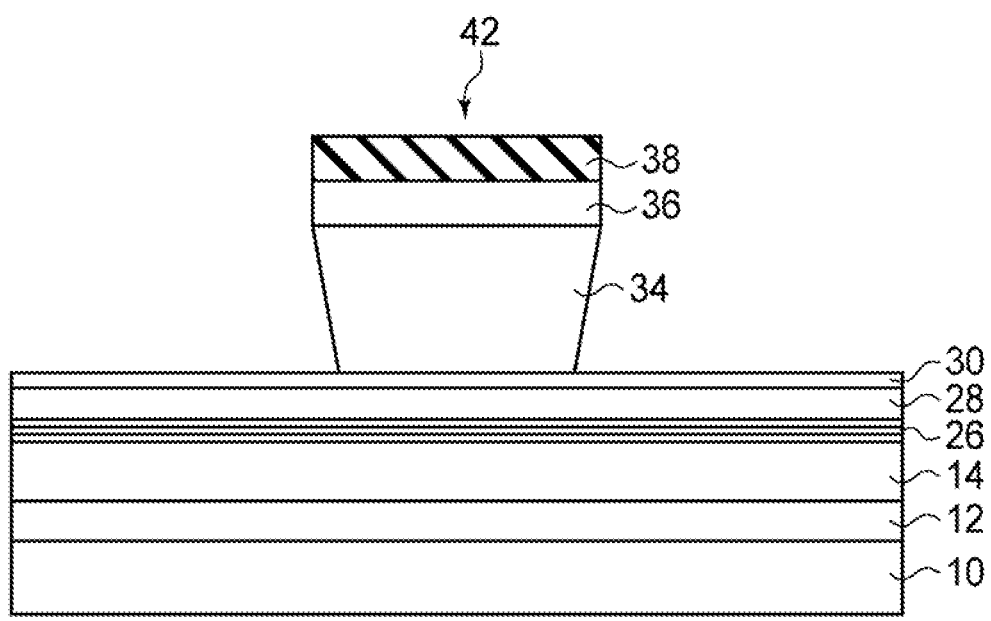
Figure 15:
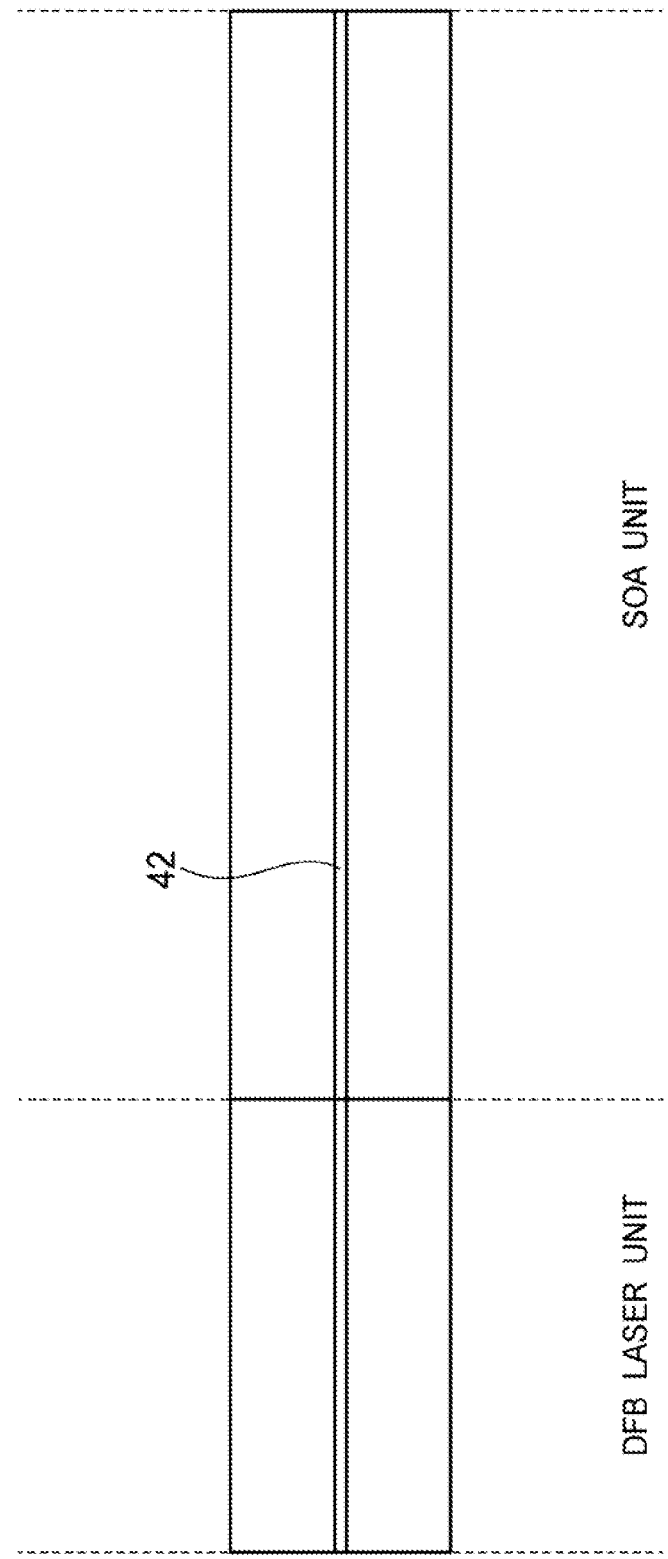
FIGS. 15, 19, 25 and 26 are plan views illustrating the method of manufacturing the semiconductor light source unit of the light emitting device according to the first embodiment.

Then, the p-GaAs contact layer 36 and the p-InGaP upper clad layer 34 are patterned by etching with the patterned silicon oxide film 38 as the mask to form the ridge waveguide structure 42 in the DFB laser unit and the SOA unit (FIGS. 14 and 15). The ridge width is set at, e.g., about 2.0 µm, whereby the excitation of higher-order transverse modes can be suppressed, and a fundamental transverse mode alone is the waveguide mode.

The p-GaAs contact layer 36 can be etched with, e.g., a mixed solution of ammonia water, hydrogen peroxide water and water. The p-InGaP upper clad layer 34 can be etched with, e.g., a hydrochloric acid, acetic acid mixed solution. The etching stops on the p-GaAs diffraction grating layer 30, which is not etched with the etchant of hydrochloric acid and acetic acid.

After the ridge waveguide structure 42 has been thus formed, the silicon oxide film 38 remaining above the p-GaAs contact layer 36 is removed by wet etching with, e.g., a buffer hydrofluoric acid aqueous solution.

Then, a silicon oxide film is deposited by, e.g., CVD method, covering the entire ridge waveguide structure 42 to form the protection film 44 of silicon oxide film.

Figure 16:
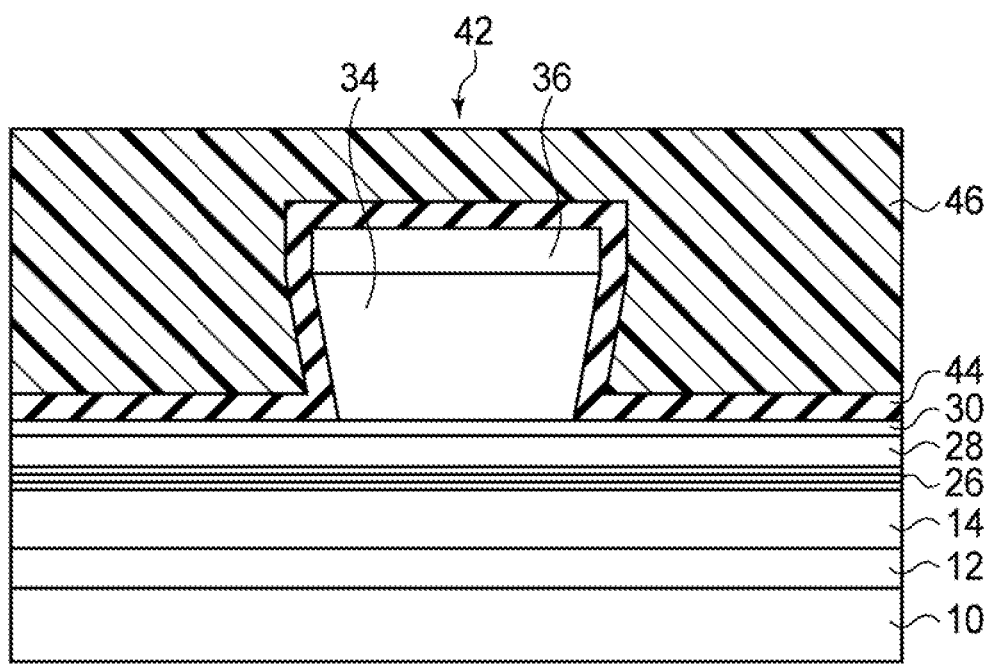

Next, an organic insulating material, e.g., BCB (benzocyclobutene) is applied to the protection film 44 by, e.g., spin coating method to fill the ridge waveguide structure and is solidified by thermal processing to form the organic insulating layer 46 (FIG. 16).

Figure 17:
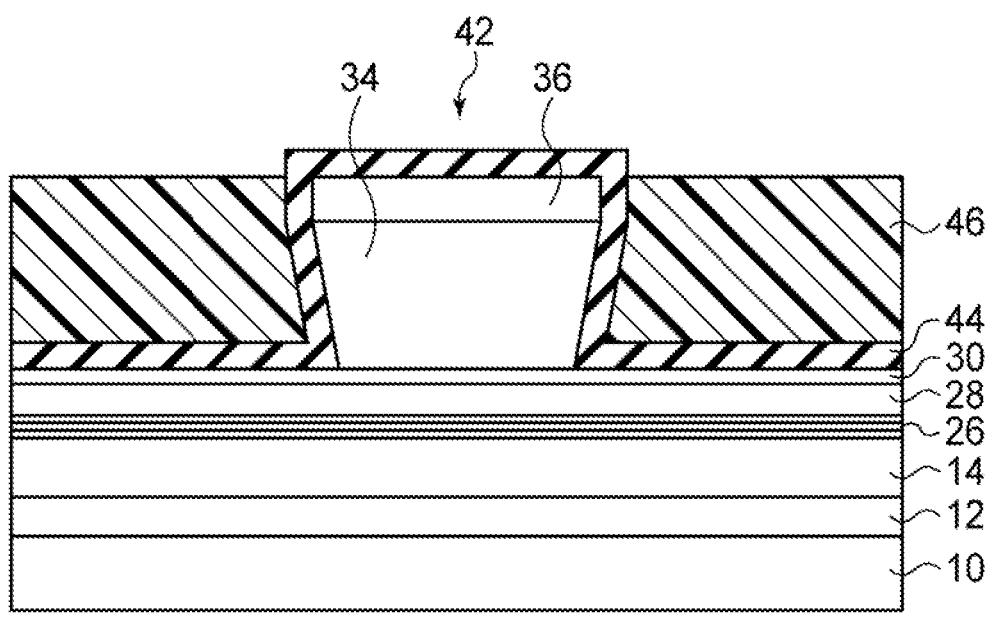

Next, the entire organic insulating layer 46 is etched by reactive ion etching (RIE) or others to expose the protection film 44 covering the top of the ridge waveguide structure 42 (FIG. 17).

Then, by photolithography, a photoresist film (not illustrated) having the patterns of the DFB laser drive electrode 50 and its electrode pad 50P, and the SOA drive electrode 52 and its electrode pad 52P is formed.

Next, with the photoresist film as the mask, that of the protection film 44, which is exposed is removed by wet etching with, e.g., a buffer hydrofluoric acid water solution to expose the p-GaAs contact layer 36 on the top of the ridge waveguide structure 42.

Then, a Ti/Pt/Au film 48 is formed above the entire surface by, e.g., electron beam evaporation method.

Figure 18:
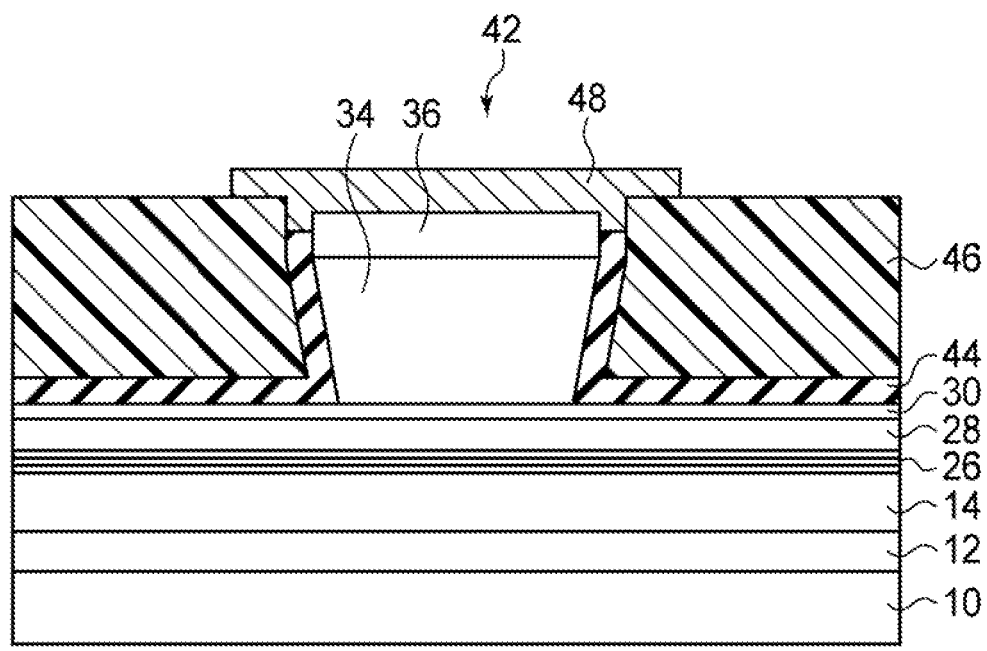

Next, the Ti/Pt/Au film on the photoresist film is removed together with the photoresist film to leave the Ti/Pt/Au film 48 selectively above the p-GaAs contact layer 36 (FIG. 18).

Figure 19:
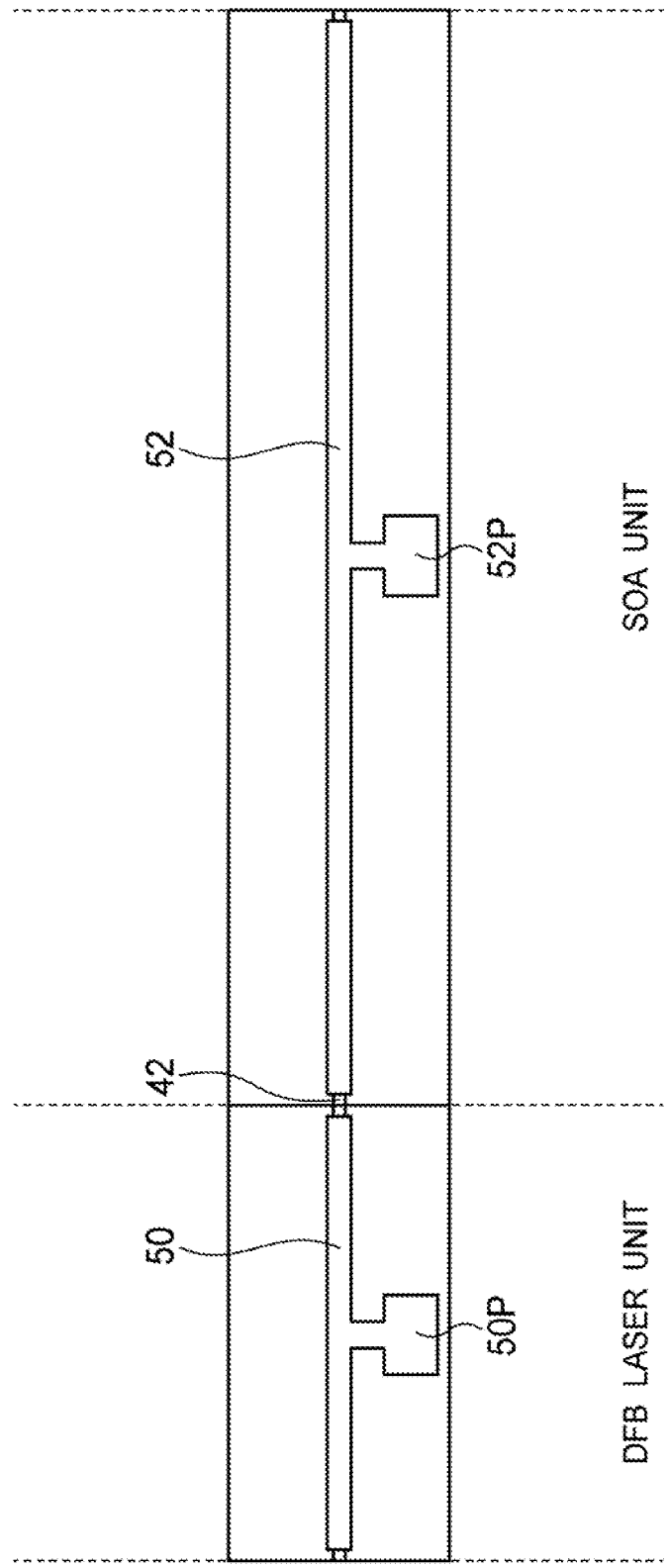

Next, thermal processing is made to form the DFB laser drive electrode 50, the electrode pad 50P and the SOA drive electrode 52 and the electrode pad 52P of the Ti/Pt/Au film 48 (FIG. 19).

Figure 20:
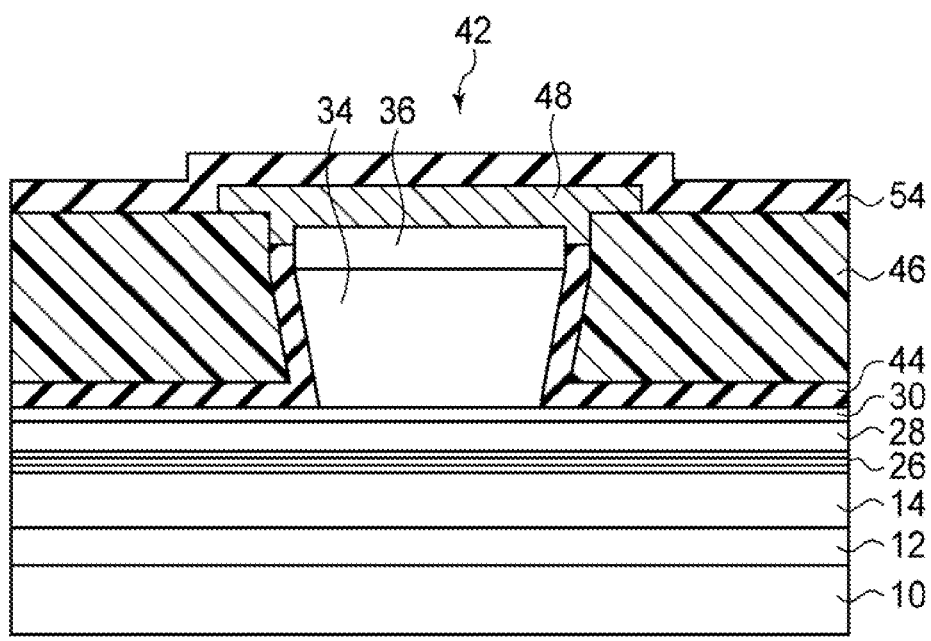

Next, a silicon oxide film is deposited above the entire surface by, e.g., CVD method to form the protection film 54 of silicon oxide film (FIG. 20). The protection film 54 is for insulating the DFB laser drive electrode 50 and the SOA drive electrode 52, and the DFB laser control heater 66 and the SOA control heater 68.

Next, a Ti/Pt/Au film 56 is formed above the protection film 54 by, e.g., electron beam evaporation method.

Figure 21:
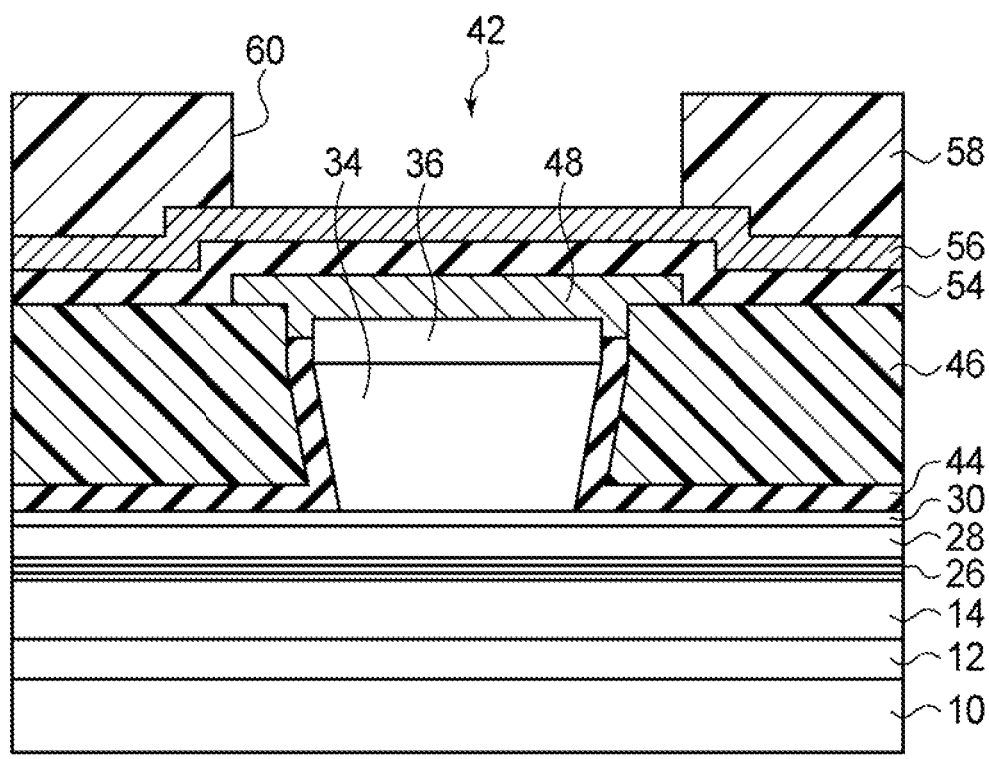

Next, a photoresist film 58 having openings 60 for the patterns of the DFB laser control heater 66 and its electrode pad 66P, and the SOA control heater 68 and its electrode pad 68P is formed by photolithography (FIG. 21).

Figure 22:
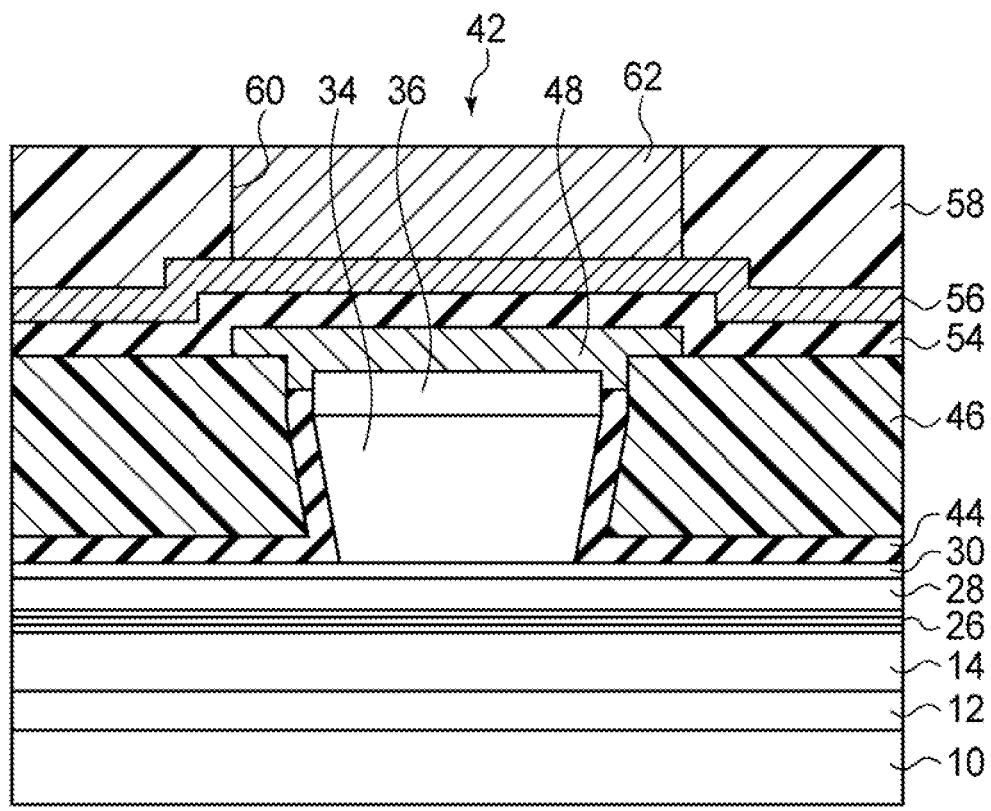

Next, an Au plating film 62 is formed in the opening 60 of the photoresist 58 with the Ti/Pt/Au film 50 as an electrode (FIG. 22).

Then, the photoresist film 58 is removed.

Figure 23:
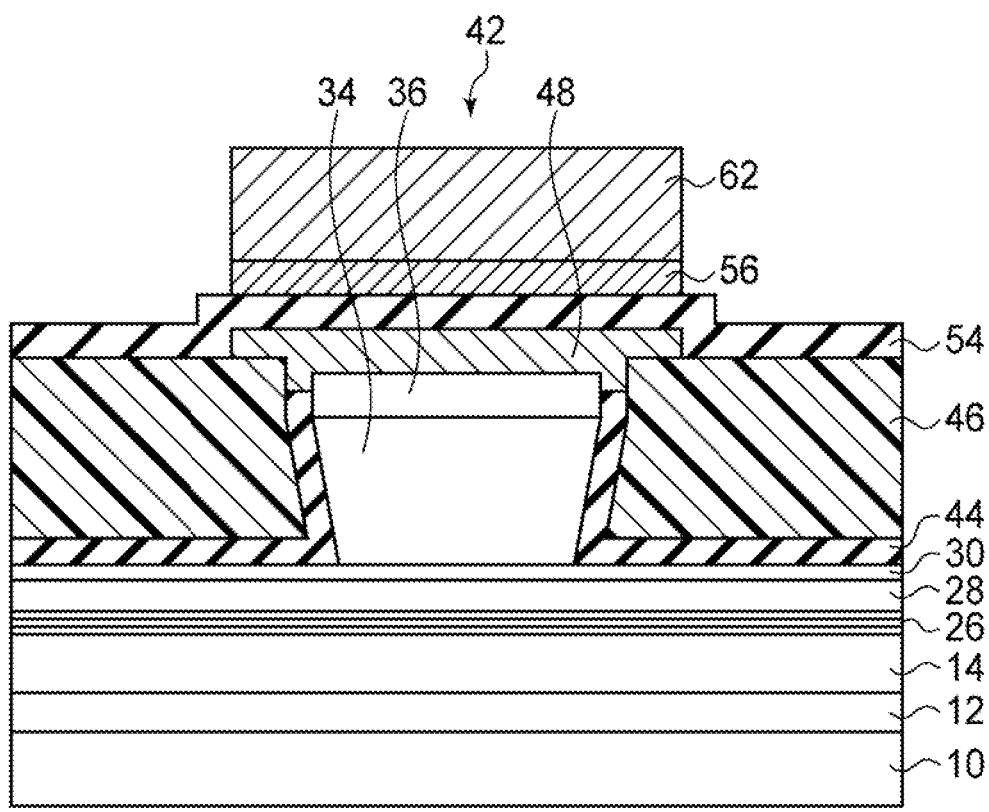

Next, with the Au plating film 62 as the mask, the entire surface is dry etched to remove the excessive Ti/Pt/Au film 56 in the region where the Au plating film 62 is absent (FIG. 23).

Next, a photoresist film having openings at the parts for the thin film heaters of the Ti/Pt structure is formed by photolithography. In the openings, the layer structure of the Ti/Pt/Au film 56 formed above the protection film 54 and the Au plating film 62 is exposed. The parts for electrode pads 66P of the DFB laser control heater 66 and the lead lines interconnecting the electrode pads 66P and the thin film heater portion of the DFB laser control heater 66, and the parts for the electrode pads 68P of the SOA control heater 68 and the lead lines interconnecting the electrode pads 68P and the thin film heater portion of the SOA control heater 68 are covered by the photoresist film.

Figure 24:
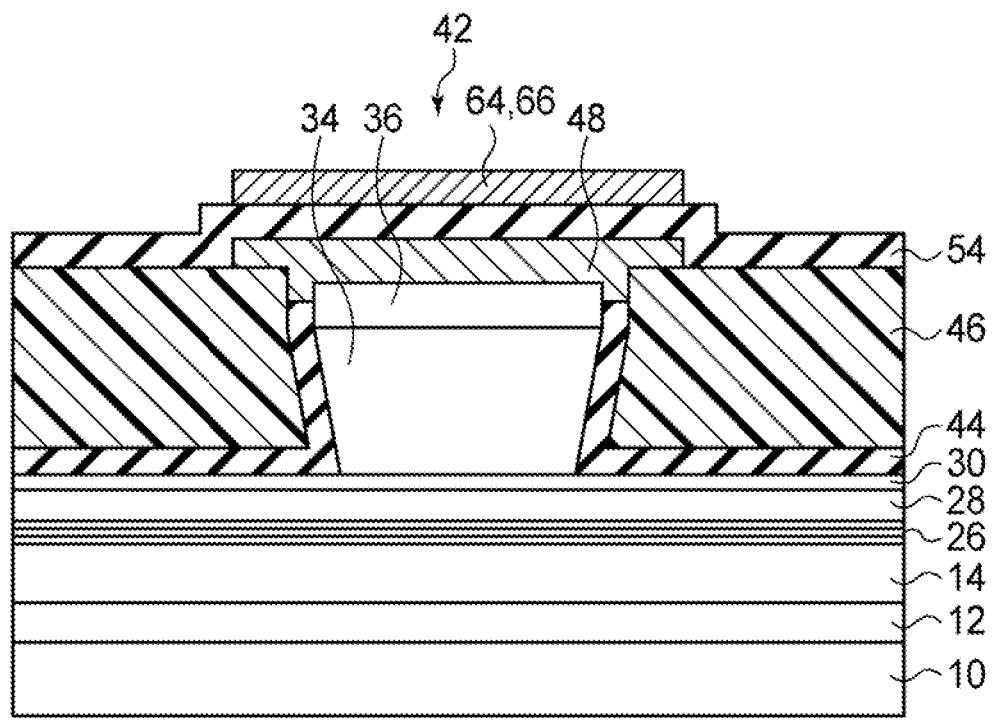

Then, the Au plating film 62 and the Au film of the Ti/Pt/Au film 56 in the opening are etched with the photoresist film as a mask by wet etching using, e.g., a cyanide group solution to form the Ti/Pt film 64 on the ridge waveguide structure 42 (FIG. 24).

Figure 25:
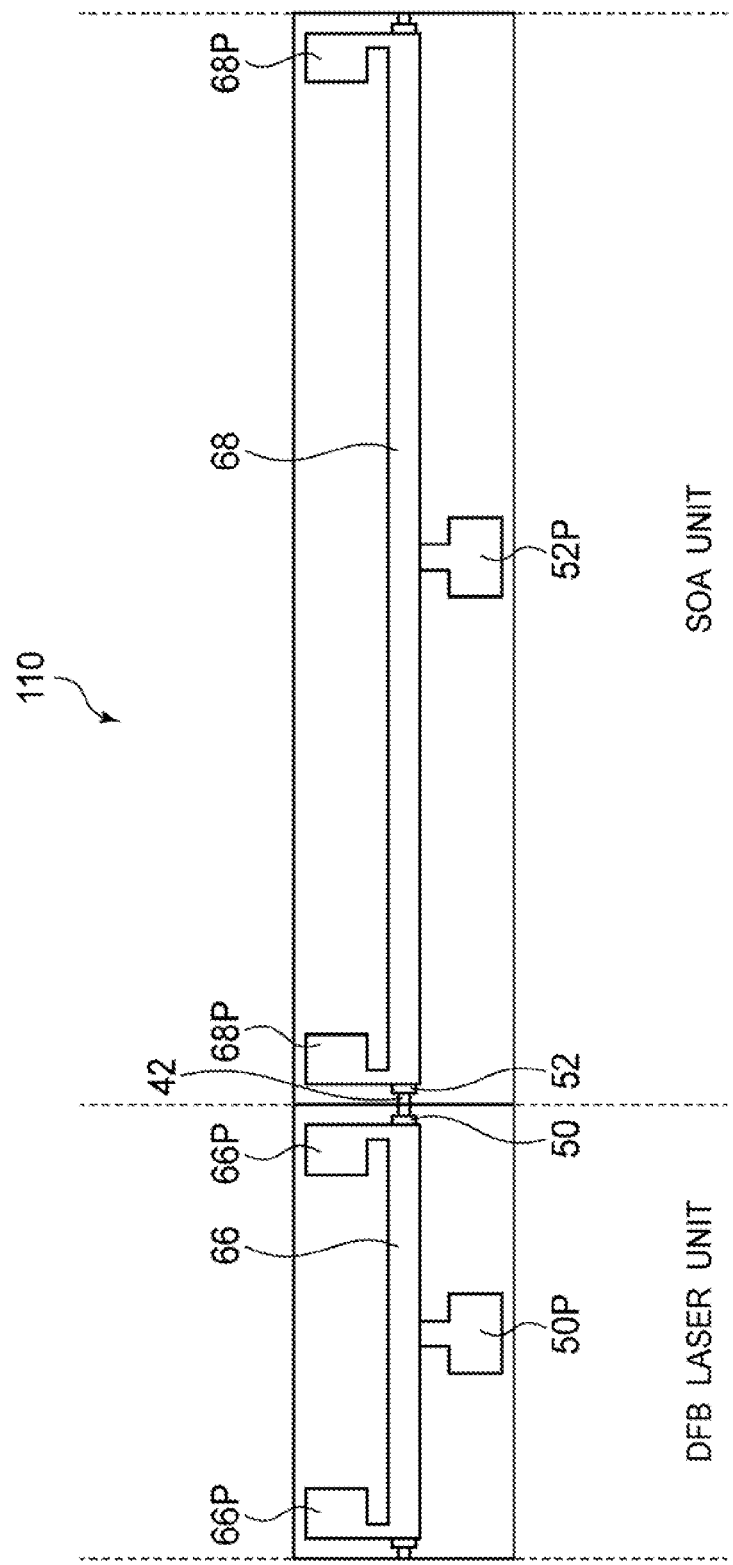

Thus, the DFB laser control heater 66 formed of the Ti/Pt film 64 and the electrode pads 66P of the Ti/Pt/Au film 56 and the Au plating film 62 are formed. The SOA control heater 68 formed of the Ti/Pt film 64 and the electrode pads 68P of the Ti/Pt/Au film 56 and the Au plated film 62 are formed (FIG. 25).

Then, a photoresist film having openings in the part for the electrode pad 50P of the DFB laser and in the part for the electrode pad 52P of the SOA is formed by photolithography.

Figure 26:
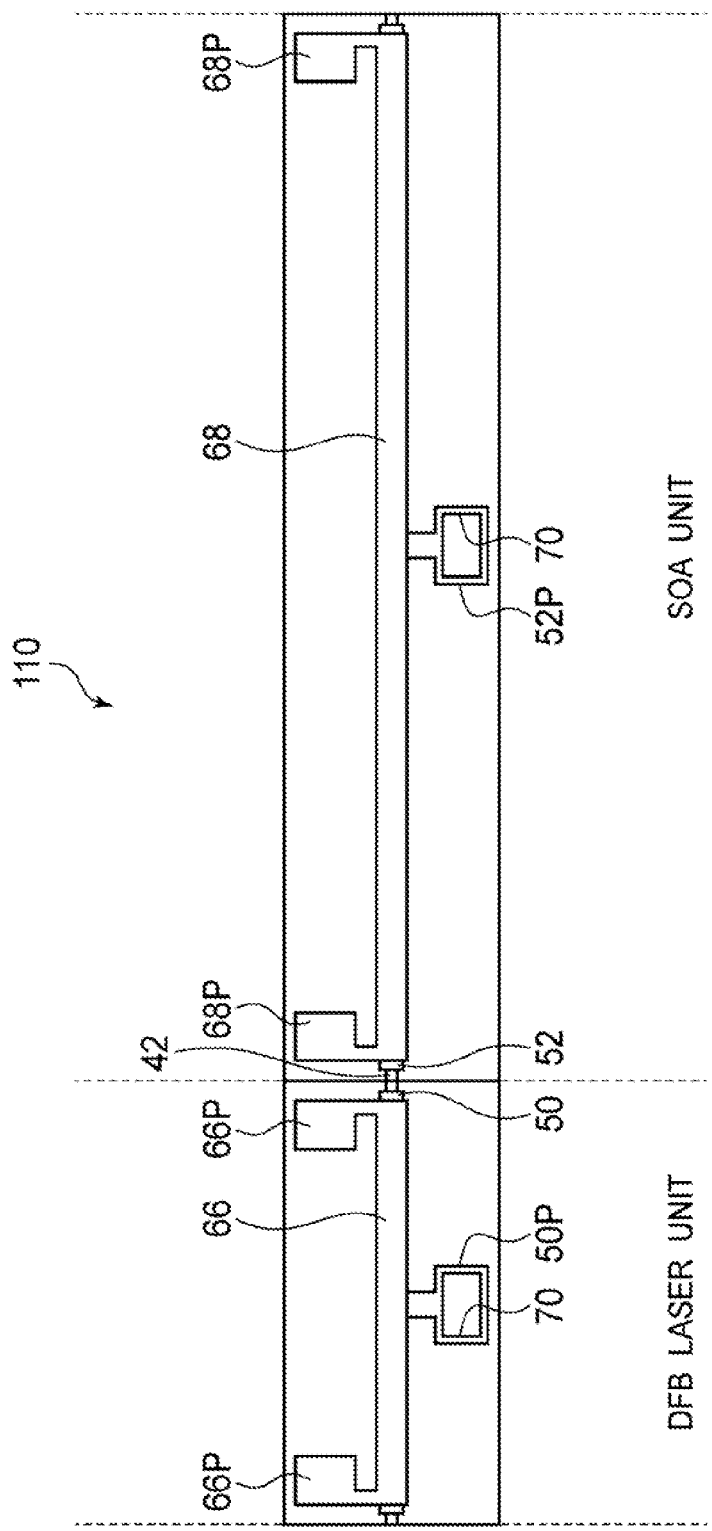

Next, the protection film 54 in the openings of the photoresist film is etched with the photoresist film as the mask by wet etching using, e.g., a buffered hydrofluoric acid aqueous solution to form the pad openings 70 in the protection film 54 (FIG. 26).

Then, polishing is made from the underside of the n-GaAs substrate 10 so that the thickness of the elements becomes about 150 µm, and then lower electrodes (not illustrated) of AuGe—Au are formed and are further plated with Au.

Then, the substrate is cleaved to make the element into a suitable length. A coating of a reflection film (HR film) of, e.g., a 95% reflectance is formed on the end surface on the side of the DFB laser, and a coating of an antireflection film (AR film) of, e.g., a 1% reflectance is formed on the end surface on the side of the SOA. The AR film is on the output side.

Thus, the semiconductor light source unit 110 including the DFB laser and SOA integrated on the same substrate, and the thin film heater mounted on the DFB laser and the SOA is formed.

The structure and manufacturing method of the SHG element 122 are the same as those of the ordinary SHG element, and their description will be omitted.

As described above, according to the present embodiment, even when the environmental temperature changes, the QPM wavelength of the SHG element, the oscillation wavelength of the DFB laser and the gain peak wavelength of the SOA can retain the suitable relationships, and the degradation of the output characteristics can be suppressed. The distortion of the output waveform due to thermal crosstalk accompanying the intensity modulation of the SOA can be suppressed.

A Second Embodiment

A light emitting device and a method of controlling the light emitting device according to a second embodiment will be described with reference to FIG. 27. The same members of the present embodiment as those of the light emitting device and a method of controlling the light emitting device according to the first embodiment illustrated in FIGS. 1 to 26 are represented by the same reference numbers not to repeat or to simplify the description.

Figure 27:
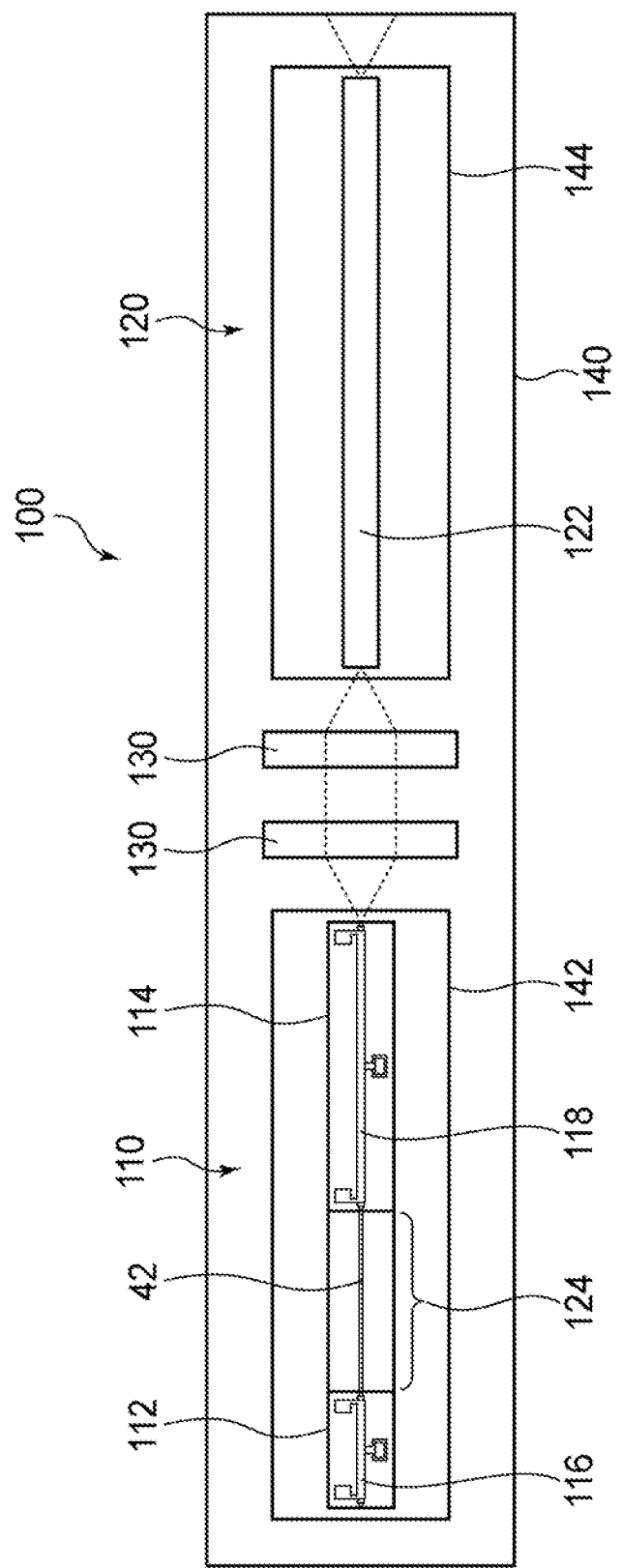
FIG. 27 is a diagrammatic view illustrating a structure of a light emitting element of a light emitting device according to a second embodiment.

FIG. 27 is a diagrammatic view illustrating a structure of a light emitting element of the light emitting device according to the present embodiment.

As illustrated in FIG. 27, the light emitting device according to the present embodiment includes a spacer region 124 between the DFB laser 112 and the SOA 114.

The spacer region 124 is provided between the DFB laser 112 and the SOA 114, whereby the electric and the thermal crosstalk between the DFB laser 112 and the SOA 114 can be buffered.

In the spacer region 124, the p-GaAs contact layer 36 of the ridge waveguide structure 42 may be removed. Thus, the electric crosstalk between the DFB laser 112 and the SOA 114 can be further suppressed.

The method of controlling the light emitting device according to the present embodiment is the same as that of the light emitting device according to the first embodiment.

As described above, according to the present embodiment, even when the environmental temperature changes, the QPM wavelength of the SHG element, the oscillation wavelength of the DFB laser and the gain peak wavelength of the SOA can retain the suitable relationships, and the degradation of the output characteristics can be suppressed. The distortion of the output waveform due to thermal crosstalk accompanying the intensity drift of the SOA can be suppressed.

A Third Embodiment

A light emitting device and a method of controlling the light emitting device according to a third embodiment will be described with reference to FIG. 28. The same members of the present embodiment as those of the light emitting device and a method of controlling the light emitting device according to the first and the second embodiments illustrated in FIGS. 1 to 27 are represented by the same reference numbers not to repeat or to simplify the description.

Figure 28:
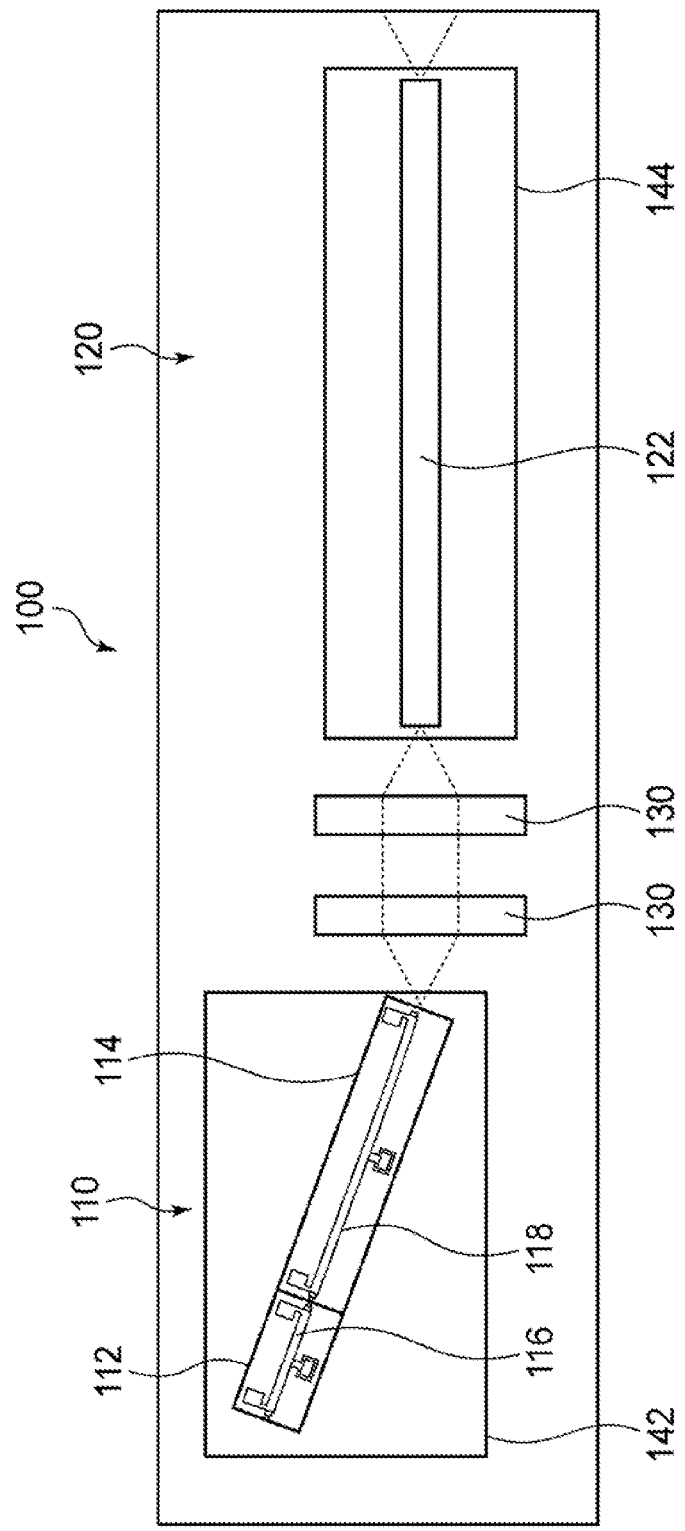
FIG. 28 is a diagrammatic view illustrating a structure of a light emitting element of a light emitting device according to a third embodiment.

FIG. 28 is a diagrammatic view illustrating a structure of a light emitting element of the light emitting device according to the present embodiment.

In the light emitting device according to the present embodiment, as illustrated in FIG. 28, the exit end surface of the SOA 114 is an angled facet (the exit end surface is arranged oblique to the cleaved surface). The SOA 114 has the angled facet, whereby the reflectivity of the forward end of the SOA 114 can be deceased. At this time, as illustrated in FIG. 28, the semiconductor light source unit 110 may be positioned oblique to the SHG element 122.

The method of controlling the light emitting device according to the present embodiment is the same as that of the light emitting device according to the first embodiment.

As described above, according to the present embodiment, even when the environmental temperature changes, the QPM wavelength of the SHG element, the oscillation wavelength of the DFB laser and the gain peak wavelength of the SOA can retain the suitable relationships, and the degradation of the output characteristics can be suppressed. The distortion of the output waveform due to thermal crosstalk accompanying the intensity modulation of the SOA can be suppressed.

Modified Embodiments

The above-described embodiments can cover other various modifications.

For example, in the above-described embodiments, the temperature control of the DFB laser based on the lookup tables 204, 208 and the temperature control of the SOA based on the lookup table 206 are made. However, the control of the DFB laser alone may be made.

The structures, the constituent materials, the manufacturing conditions, etc. of the light emitting device described in the above embodiments are only one example and can be modified or changed suitably corresponding to the technical common senses of the skilled in the art.

For example, in the above-described embodiments, an n-GaAs substrate is used as the substrate 10, but a p-GaAs substrate may be used. The substrate material is not limited to GaAs and can be InP or others.

The compositions of the respective layers are not limited to that described in the above embodiments. Other materials may be used as long as the crystal grown is possible.

In the above embodiments, the diffraction grating layer 32 is provided above the active layer 26, but the diffraction grating layer 32 may be provided below the active layer 26.

In the above embodiments, the DFB laser is used as the semiconductor laser, but the DFB laser is not essential as long as the laser can makes the single longitudinal mode oscillation. For example, a DBR laser may be used in place of the DFB laser.

In the above embodiments, the DFB laser control heater and the SOA control heater are arranged respectively above the ridge waveguide structure, but this arrangement is not essential as long as the DFB laser control heater and the SOA control heater can be discretely heated.

In the above embodiments is described the module that laser beam of 530 nm-wavelength band are outputted by using the master light source of 1060 nm-wavelength band and the SHG element. The same techniques and control can be applied to other wavelength bands.

Each lookup table of the control unit 200 illustrated in FIG. 5 may be stored in one memory. The memories 210, 212 may be formed in the same memory. The circuit structure of the control unit 200 is not limited to the structure illustrated in FIG. 5.

The control method described in the above-embodiments is described concerning the main points. In the actual control, the control method should be changed as required and is not limited to the above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A light emitting device comprising:
   a semiconductor laser, which oscillates in a single longitudinal mode, formed above a semiconductor substrate;
   a first heater, which controls a temperature of the semiconductor laser, provided near the semiconductor laser;
   a gain unit, which amplifies a beam outputted from the semiconductor laser and outputs an amplified beam, formed above the semiconductor substrate;
   a second heater, which controls a temperature of the gain unit, provided near the gain unit; and
   a second harmonic generation element, which converts the amplified beam outputted from the gain unit to a second harmonic light and outputs the second harmonic light.

2. The light emitting device according to claim 1, further comprising:
   a temperature monitor which measures an environmental temperature; and
   a control unit which controls the first heater, based on the environmental temperature measured by the temperature monitor and an input signal for driving the gain unit.

3. The light emitting device according to claim 2, wherein the control unit controls the first heater, based on a first drive signal for matching an oscillation wavelength of the semiconductor laser with a quasi phase matching wavelength of the second harmonic generation element at the environmental temperature and a second drive signal for compensating a temperature increase of the semiconductor laser based on the input signal into the gain unit.

4. The light emitting device according to claim 3, further comprising:
   a memory, which stores a first lookup table describing a relationship between the environmental temperature and the drive signal of the first heater for matching the oscillation wavelength of the semiconductor laser with the quasi phase matching wavelength of the second harmonic generation element, and a second lookup table describing a relationship between the input signal into the gain unit and the drive signal of the first heater for compensating the temperature increase of the semiconductor laser by the input signal into the gain unit, wherein
   the control unit generates the first drive signal, based on the first lookup table and generates the second drive signal, based on the second lookup table.

5. The light emitting device according to claim 4, wherein the control unit makes a time-averaging processing on the input signal into the gain unit and generates the second drive signal, based on a value of an averaged input signal.

6. The light emitting device according to claim 4, wherein the control unit generates the second drive signal having a delay time added, which corresponds to a time lug between a change of the input signal in the gain unit and a temperature change of the semiconductor laser.

7. The light emitting device according to claim 2, wherein the control unit controls the second heater, based on the environment temperature measured by the temperature monitor.

8. The light emitting device according to claim 7, wherein the control unit controls the second heater, based on the third drive signal for making a detuning between the quasi phase matching wavelength of the second harmonic generation element at the environmental temperature and a gain peak wavelength of the gain unit below a prescribed value.

9. The light emitting device according to claim 7, further comprising:
   a memory, which store a third lookup table describing a relationship between the environmental temperature, and the drive signal of the second heater for making a detuning between the quasi phase matching wavelength of the second harmonic generation element and a gain peak wavelength of the gain unit below the prescribed value,
   the control unit generates the third drive signal, based on the third lookup table.

10. The light emitting device according to claim 1, wherein the semiconductor laser and the second harmonic generation element are so designed that an oscillation wavelength of the semiconductor laser at a maximum value of an environmental temperature assumed in an operation matches with a quasi phase matching wavelength of the second harmonic generation element.

11. The light emitting device according to claim 1, wherein the gain unit is so designed that a detuning between a gain peak wavelength at a maximum value of an environmental temperature assumed in an operation and an oscillation wavelength of the semiconductor laser becomes a prescribed value.

12. The light emitting device according to claim 1, wherein the semiconductor substrate is formed above a first heat sink, and
    the second harmonic generation element is formed above a second heat sink which is different from the first heat sink.

13. The light emitting device according to claim 1, wherein a spacer region is provided between the semiconductor laser and the gain unit.

14. The light emitting device according to claim 1, wherein the semiconductor laser and the gain unit are arranged oblique to the second harmonic generation element.

15. A method of controlling a light emitting device including a semiconductor laser which oscillates in a single longitudinal mode; a first heater which controls a temperature of the semiconductor laser; a gain unit which amplifies a beam outputted from the semiconductor laser and outputs an amplified beam; a second heater which controls a temperature of the gain unit; a second harmonic generation element which converts the amplified beam outputted from the gain unit to a second harmonic light and outputs the second harmonic light; and a temperature monitor which measures an environmental temperature, the method comprising:
    measuring the environmental temperature by the temperature monitor;
    generating a first drive signal of the first heater for matching an oscillation wavelength of the semiconductor laser with a quasi phase matching wavelength of the second harmonic generation element at the environmental temperature, based on the environmental temperature measured by the temperature monitor;
    generating a second drive signal of the first heater for compensating a temperature increase of the semiconductor laser by the input signal into the gain unit, based on an input signal for driving the gain unit; and driving the first heater, based on the first drive signal and the second drive signal and controlling the temperature of the semiconductor laser.

16. The method of controlling a light emitting device according to claim 15, further comprising:
generating a third drive signal for making a detuning between the quasi phase matching wavelength of the second harmonic generation element at the environmental temperature and a gain peak wavelength of the gain unit below a prescribed value, based on the environmental temperature measured by the temperature monitor; and
controlling a temperature of the gain unit by driving the second heater by the third drive signal.

17. The method of controlling a light emitting device according to claim 15, wherein
the input signal in the gain unit is time-averaged, and, the second drive signal is generated based on a value of an averaged input signal.

18. The method controlling a light emitting device according to claim 15, wherein
a delay time corresponding to a time lug between a change of the input signal into the gain unit and a temperature change of the semiconductor laser is added to the second drive signal.

* * * * *